(12) United States Patent
Sano et al.

(10) Patent No.: US 11,818,486 B2
(45) Date of Patent: Nov. 14, 2023

(54) SOLID-STATE IMAGING APPARATUS, IMAGING SYSTEM, AND DISTANCE MEASUREMENT METHODS

(71) Applicant: SONY GROUP CORPORATION, Tokyo (JP)

(72) Inventors: Takuya Sano, Tokyo (JP); Toshifumi Wakano, Kanagawa (JP)

(73) Assignee: SONY GROUP CORPORATION, Tokyo (JP)

( * ) Notice: Subject to any disclaimer, the term of this patent is extended or adjusted under 35 U.S.C. 154(b) by 0 days.

(21) Appl. No.: 17/403,519

(22) Filed: Aug. 16, 2021

(65) Prior Publication Data

US 2021/0377473 A1 Dec. 2, 2021

Related U.S. Application Data

(63) Continuation of application No. 16/715,653, filed on Dec. 16, 2019, now Pat. No. 11,128,828, which is a
(Continued)

(30) Foreign Application Priority Data

Apr. 14, 2015 (JP) ................................. 2015-082301

(51) Int. Cl.
*G01S 17/08* (2006.01)
*H04N 25/76* (2023.01)
(Continued)

(52) U.S. Cl.
CPC ............ *H04N 25/76* (2023.01); *G01S 17/36* (2013.01); *G01S 17/86* (2020.01); *G01S 17/894* (2020.01);
(Continued)

(58) Field of Classification Search
None
See application file for complete search history.

(56) References Cited

U.S. PATENT DOCUMENTS 8,599,291 B2 * 12/2013 Min ...................... H04N 5/332
348/280
11,076,115 B2 7/2021 Sano et al.
(Continued)

FOREIGN PATENT DOCUMENTS

CN 101651145 2/2010
JP H05-048973 2/1993
(Continued)

OTHER PUBLICATIONS

International Search Report and Written Opinion for International (PCT) Patent Application No. PCT/JP2016/056714, dated May 24, 2016, 6 pages.
(Continued)

*Primary Examiner* — David P Porta
*Assistant Examiner* — Mamadou Faye
(74) *Attorney, Agent, or Firm* — SHERIDAN ROSS P.C.

(57) ABSTRACT

To improve accuracy of distance measurement using a Z pixel having the same size as size of a visible light pixel. In a solid-state imaging apparatus, a visible light converting block includes a plurality of visible light converting units in which light receiving faces for receiving visible light are disposed and configured to generate electric charges in accordance with a light receiving amount of the received visible light, and a visible light electric charge holding unit configured to exclusively hold the electric charges respectively generated by the plurality of visible light converting units in periods different from each other. An infrared light converting block includes a plurality of infrared light converting units in which light receiving faces which have substantially the same size as size of the light receiving faces
(Continued)

of the visible light converting units and which receive infrared light are disposed and configured to generate electric charges in accordance with a light receiving amount of the received infrared light, and an infrared light electric charge holding unit configured to collectively and simultaneously hold the electric charges respectively generated by the plurality of infrared light converting units.

13 Claims, 21 Drawing Sheets

Related U.S. Application Data continuation of application No. 15/550,477, filed as application No. PCT/JP2016/056714 on Mar. 4, 2016, now Pat. No. 11,076,115.

(51) Int. Cl.
| | |
|---|---|
| H01L 27/146 | (2006.01) |
| G01S 17/36 | (2006.01) |
| G01S 17/86 | (2020.01) |
| G01S 17/894 | (2020.01) |
| H04N 23/10 | (2023.01) |
| H04N 25/77 | (2023.01) |
| H04N 25/13 | (2023.01) |
| H04N 25/702 | (2023.01) |
| G01C 3/08 | (2006.01) |

(52) U.S. Cl.
CPC .. *H01L 27/14621* (2013.01); *H01L 27/14623* (2013.01); *H01L 27/14627* (2013.01); *H01L 27/14641* (2013.01); *H01L 27/14645* (2013.01); *H01L 27/14647* (2013.01); *H01L 27/14649* (2013.01); *H04N 23/10* (2023.01); *H04N 25/134* (2023.01); *H04N 25/702* (2023.01); *H04N 25/77* (2023.01); *G01C 3/08* (2013.01)

(56) References Cited

U.S. PATENT DOCUMENTS

| 11,128,828 | B2 | 9/2021 | Sano et al. |
| 2006/0192086 | A1 | 8/2006 | Niclass et al. |
| 2009/0021612 | A1 | 1/2009 | Hamilton, Jr. et al. |
| 2010/0033611 | A1* | 2/2010 | Lee .................... H04N 5/37457 348/302 |
| 2010/0102366 | A1 | 4/2010 | Lee et al. |
| 2010/0271522 | A1* | 10/2010 | Matsunaga .......... H04N 5/2176 348/E5.091 |
| 2011/0310282 | A1 | 12/2011 | Toda et al. |
| 2014/0217474 | A1 | 8/2014 | Lee et al. |

FOREIGN PATENT DOCUMENTS

| JP | 2009-158944 | 7/2009 |
| JP | 2010-041720 | 2/2010 |
| JP | 2013-070030 | 4/2013 |
| JP | 2014-067948 | 4/2014 |
| JP | 2014-116741 | 6/2014 |
| JP | 2014-514733 | 6/2014 |
| JP | 2014-140020 | 7/2014 |
| JP | 2014-192348 | 10/2014 |
| JP | 2014-239416 | 12/2014 |
| JP | 2015-186006 | 10/2015 |

OTHER PUBLICATIONS

Official Action (with English translation) for Japan Patent Application No. 2017-512227, dated Sep. 8, 2020, 5 pages.
Official Action (with English translation) for China Patent Application No. 201680010038.4, dated Jan. 22, 2021, 18 pages.
Official Action for U.S. Appl. No. 15/550,477, dated Jul. 31, 2018, 13 pages.
Official Action for U.S. Appl. No. 15/550,477, dated Jan. 25, 2019, 11 pages.
Notice of Allowance for U.S. Appl. No. 15/550,477, dated Mar. 15, 2021, 10 pages.
Corrected Notice of Allowance for U.S. Appl. No. 15/550,477, dated Apr. 27, 2021, 3 pages.
Official Action for U.S. Appl. No. 16/715,653, dated Apr. 29, 2020, 9 pages.
Official Action for U.S. Appl. No. 16/715,653, dated Oct. 30, 2020, 9 pages.
Notice of Allowance for U.S. Appl. No. 16/715,653, dated May 19, 2021, 10 pages.

* cited by examiner a b

SOLID-STATE IMAGING APPARATUS, IMAGING SYSTEM, AND DISTANCE MEASUREMENT METHODS

CROSS REFERENCE TO RELATED APPLICATIONS

This application is a continuation of and claims priority to U.S. patent application Ser. No. 16/715,653, filed Dec. 16, 2019, which is a continuation of and claims priority to U.S. patent application Ser. No. 15/550,477, filed Aug. 11, 2017, now U.S. Pat. No. 11,076,115, which is a national stage application under 35 U.S.C. 371 and claims the benefit of PCT Application No. PCT/JP2016/056714 having an international filing date of Mar. 4, 2016, which designated the United States, which PCT application claimed the benefit of Japanese Patent Application No. 2015-082301 filed Apr. 14, 2015, the disclosures of which are incorporated herein by reference in their entirety.

TECHNICAL FIELD

The present technology relates to a solid-state imaging apparatus, an imaging system and a distance measurement method. More particularly, the present technology relates to a solid-state imaging apparatus having a distance measurement pixel for measuring a distance to a subject, an imaging system and a distance measurement method for these.

BACKGROUND ART

In related art, an imaging system which measures a distance to a subject by irradiating the subject with infrared light, receiving reflected infrared light and measuring a time period from irradiation to light reception is used. Such a scheme which is referred to as a time of flight (TOF) scheme, is a scheme widely used to detect motion of the subject or measure a three-dimensional shape. An imaging element used in this imaging system is configured with a visible light pixel having a photoelectric conversion element which converts visible light into an electrical signal, and an infrared light pixel having a photoelectric conversion element which converts reflected infrared light into an electrical signal. A distance is measured by this infrared light pixel. Here, such an infrared light pixel is referred to as a distance measurement pixel. Because, normally, infrared light attenuates in the process of propagation, in the case where an infrared light pixel having the same size as size of a visible light pixel is used as a distance measurement pixel, sensitivity of photoelectric conversion becomes insufficient, and accuracy of distance measurement degrades. To prevent this, it is desirable to use a distance measurement pixel with high sensitivity. Therefore, a system is proposed which uses a distance measurement pixel having a photoelectric conversion element whose light-receiving area is four times as large as a light-receiving area of a photoelectric conversion element of a visible light pixel (see, for example, Patent Literature 1).

CITATION LIST

Patent Literature

Patent Literature 1: US Unexamined Patent Application Publication No. 2006/0192086

DISCLOSURE OF INVENTION

Technical Problem

In the above-described related art, a single photon avalanche diode (SPAD) is used as a photoelectric conversion element, and this SPAD element is configured to have a light receiving area four times as large as that of a photoelectric conversion element of a visible light pixel. By this means, it is possible to measure a distance with weak reflected light by improving sensitivity of photoelectric conversion. However, because a distance measurement pixel having a larger area than that of a visible light pixel is required, it is necessary to manufacture an imaging element in accordance with a design rule different from that for a normal imaging element. Therefore, there is a problem that it requires high cost.

The present technology has been created in view of such circumstances and it is desirable to improve accuracy of distance measurement using a distance measurement pixel configured to have the same size as that of a visible light pixel.

Solution to Problem

The present technology has been made to solve the above problem. According to a first aspect of the present technology, a solid-state imaging apparatus includes: a visible light converting block that includes a plurality of visible light converting units in which light receiving faces for receiving visible light are disposed and configured to generate electric charges in accordance with a light receiving amount of the received visible light, and a visible light electric charge holding unit configured to exclusively hold the electric charges respectively generated by the plurality of visible light converting units in periods different from each other; and an infrared light converting block that includes a plurality of infrared light converting units in which light receiving faces which have substantially the same size as size of the light receiving faces of the visible light converting units and which receive infrared light are disposed and configured to generate electric charges in accordance with a light receiving amount of the received infrared light, and an infrared light electric charge holding unit configured to collectively and simultaneously hold the electric charges respectively generated by the plurality of infrared light converting units. By this means, an effect that electric charges respectively generated by the above-described plurality of infrared light converting units are collectively held at the same time is provided.

In addition, according to the first aspect, the visible light converting block may include the four visible light converting units and the visible light electric charge holding unit. By this means, an effect that the above-described visible light converting block has four visible light converting units is provided.

In addition, according to the first aspect, the infrared light converting block may include the four infrared light converting units and the infrared light electric charge holding unit. By this means, an effect that the above-described infrared light converting block has four infrared light converting units is provided.

In addition, according to the first aspect, the infrared light converting block may include: the two infrared light converting units; the two visible light converting units; and the infrared light electric charge holding unit configured to collectively and simultaneously hold the electric charges respectively generated by the two infrared light converting units in the case of holding the electric charges generated by the two infrared light converting units, and exclusively hold the electric charges respectively generated by the two visible light converting units in periods different from each other in the case of holding the electric charges generated by the two visible light converting units. By this means, an effect that the above-described infrared light converting block has two infrared light converting units and two visible light converting units is provided.

In addition, according to the first aspect, the visible light converting block may include the visible light electric charge holding unit and the four visible light converting units in which a red light converting unit which is the visible light converting unit configured to generate the electric charge in accordance with red light, a green light converting unit which is the visible light converting unit configured to generate the electric charge in accordance with green light, and a blue light converting unit which is the visible light converting unit configured to generate the electric charge in accordance with blue light are arranged in a Bayer array. By this means, an effect that the above-described visible light converting block has four visible light converting units disposed in a Bayer array is provided.

In addition, according to the first aspect, the visible light converting block may include a red light converting unit which is the visible light converting unit configured to generate the electric charge in accordance with red light, a green light converting unit which is the visible light converting unit configured to generate the electric charge in accordance with green light, a blue light converting unit which is the visible light converting unit configured to generate the electric charge in accordance with blue light, a white light converting unit which is the visible light converting unit configured to generate the electric charge in accordance with white light, and the visible light electric charge holding unit. By this means, an effect that the above-described visible light converting block has four visible light converting units of the above-described red light converting unit, the above-described green light converting unit, the above-described blue light converting unit and the above-described white light converting unit is provided.

In addition, according to the first aspect, the infrared light converting block may further include an infrared light electric charge transferring unit configured to transfer the electric charges respectively generated by the plurality of infrared light converting units to the infrared light electric charge holding unit by conducting electricity between the plurality of infrared light converting units and the infrared light electric charge holding unit at a same time. By this means, an effect that the above-described electric charges generated by the above-described plurality of infrared light converting units are transferred to the above-described infrared light holding unit at the same time is provided.

In addition, according to the first aspect, the solid-state imaging apparatus may further include an infrared light signal generating unit configured to generate a signal in accordance with the electric charge held in the infrared light electric charge holding unit. By this means, an effect that a signal in accordance with the above-described electric charges held in the above-described infrared light electric charge holding unit is generated is provided.

In addition, according to a second aspect of the present technology, an imaging system includes: an infrared light emitting unit configured to emit infrared light to a subject; a visible light converting block that includes a plurality of visible light converting units in which light receiving faces for receiving visible light are disposed and configured to generate electric charges in accordance with a light receiving amount of the received visible light, and a visible light electric charge holding unit configured to exclusively hold the electric charges respectively generated by the plurality of visible light converting units in periods different from each other; an infrared light converting block that includes a plurality of infrared light converting units in which light receiving faces which have substantially the same size as size of the light receiving faces of the visible light converting units and which receive infrared light emitted and reflected by the subject are disposed and configured to generate electric charges in accordance with a light receiving amount of the received infrared light, and an infrared light electric charge holding unit configured to collectively and simultaneously hold the electric charges respectively generated by the plurality of infrared light converting units; an infrared light signal generating unit configured to generate a signal in accordance with the electric charge held in the infrared light electric charge holding unit; and a distance measurement unit configured to measure a distance to the subject by measuring a time period from the emission at the infrared light emitting unit to the light reception at the infrared light converting unit of the infrared light converting block on the basis of the generated signal. By this means, an effect that the electric charges respectively generated by the above-described plurality of infrared light converting units are collectively held at the same time is provided.

In addition, according to a third aspect of the present technology, a distance measurement method includes: an infrared light emitting step of emitting infrared light to a subject; an infrared light signal generating step of generating a signal in accordance with electric charges held in an infrared light electric charge holding unit in an infrared light converting block including a plurality of infrared light converting units in which light receiving faces which have substantially the same size as size of light receiving faces of visible light converting units in a visible light converting block and which receive infrared light emitted and reflected by the subject are disposed and configured to generate electric charges in accordance with a light receiving amount of the received infrared light and the infrared light electric charge holding unit configured to collectively and simultaneously hold the electric charges respectively generated by the plurality of infrared light converting units, the visible light converting block including a plurality of visible light converting units in which the light receiving faces for receiving visible light are disposed and configured to generate electric charges in accordance with a light receiving amount of the received visible light and a visible light electric charge holding unit configured to exclusively hold the electric charges respectively generated by the plurality of visible light converting units in periods different from each other; and a distance measurement step of measuring a distance to the subject by measuring a time period from emission of the infrared light to the light reception at the infrared light converting unit of the infrared light block on the basis of the generated signal. By this means, an effect that the electric charges respectively generated by the above-described plurality of infrared light converting units are collectively held at the same time is provided.

Advantageous Effects of Invention

According to the present technology, it is possible to provide a preferred advantageous effect of improving accuracy of distance measurement using a distance measurement pixel having the same size as that of a visible light pixel. Meanwhile, the effects described herein are not necessarily limited and may be effects described in the present disclosure.

MODES FOR CARRYING OUT THE INVENTION

Embodiments for implementing the present technology (hereinafter, referred to as embodiments) will be described below. Description will be provided in the following order.

1. First embodiment (example in the case where infrared light converting block is configured with two infrared light converting pixels and two visible light converting pixels)
2. Second embodiment (example in the case where infrared light block is configured with four infrared light converting pixels)
3. Third embodiment (example in the case where infrared light converting block is configured with one infrared light converting pixel and three visible light converting pixels)
4. Fourth embodiment (example in the case where infrared light converting pixels are disposed at positions of G pixels in Bayer array)
5. Fifth embodiment (example in the case where two electric charge holding units are connected to photoelectric converting unit)

1. First Embodiment

Figure 1:
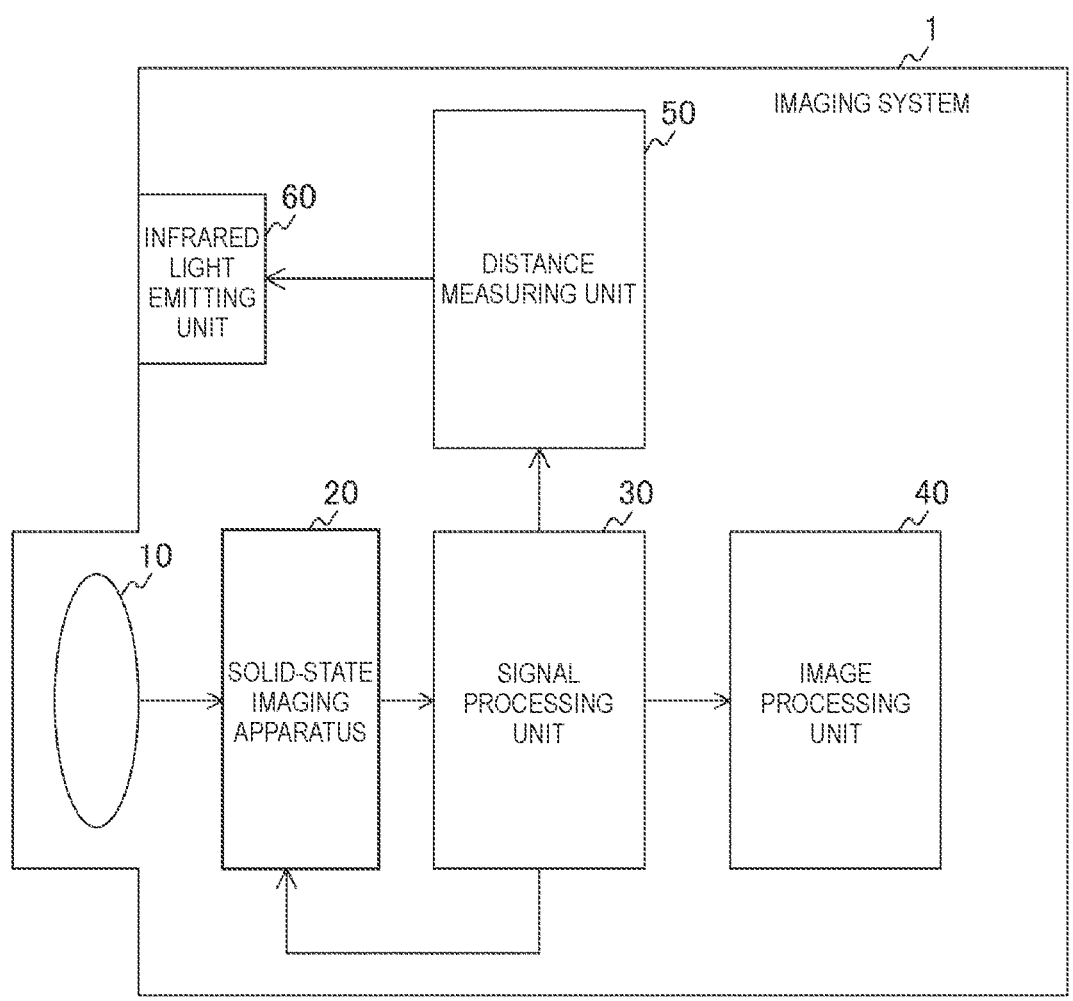
FIG. 1 is a diagram illustrating a configuration example of an imaging system 1 in an embodiment of the present technology.

[Configuration of Imaging System]
FIG. 1 is a diagram illustrating a configuration example of an imaging system 1 in an embodiment of the present technology. The imaging system 1 includes a lens 10, a solid-state imaging apparatus 20, a signal processing unit 30, an image processing unit 40, a distance measurement unit 50 and an infrared light emitting unit 60.

The lens 10 optically forms an image of a subject to the solid-state imaging apparatus 20. The solid-state imaging apparatus 20 converts the optical image formed by the lens 10 into an image signal and outputs the image signal. In the solid-state imaging apparatus 20, pixels for generating an image signal are disposed in two dimensions on a plane where the optical image is formed. The pixels include a visible light pixel for visible light and an infrared light pixel for infrared light in the optical image.

The visible light pixel is a pixel for generating a signal in accordance with received visible light, and examples of the visible light pixel can include three types of pixels of a pixel for generating a signal in accordance with red light (R pixel), a pixel for generating a signal in accordance with green light (G pixel) and a pixel for generating a signal in accordance with blue light (B pixel). An image signal of a subject is formed with a visible light signal which is a signal generated by these pixels.

Meanwhile, the infrared light pixel is a pixel for generating an infrared signal which is a signal in accordance with received infrared light. The infrared light pixel in the embodiment of the present technology receives infrared light emitted from an infrared light emitting unit 60 which will be described later and reflected by the subject and generates an infrared light signal. By measuring a time period from emission of the infrared light to reception of the infrared light, a distance to the subject is measured. The infrared light pixel corresponds to the above-mentioned distance measurement pixel (hereinafter, referred to as a Z pixel). A configuration of the solid-state imaging apparatus 20 and details of distance measurement will be described later.

The signal processing unit 30 processes the image signal output from the solid-state imaging apparatus 20. The signal processing unit 30 separates the image signal output from the solid-state imaging apparatus 20 into a visible light signal and an infrared light signal and outputs the visible light signal and the infrared light signal respectively to the image processing unit 40 and the distance measurement unit 50. Further, the signal processing unit 30 also controls the solid-state imaging apparatus 20.

The image processing unit 40 performs image processing on the visible light signal output from the signal processing unit 30. As the image processing, for example, de-mosaic processing for interpolating signals of other lacking color with respect to a unicolor visible light signal generated by the solid-state imaging apparatus 20, processing of converting a visible light signal into a luminance signal and a color difference signal, or the like, can be performed. The image signal processed by the image processing unit 40 is, for example, output to outside the imaging system 1 by way of a signal line (which is not illustrated).

The distance measurement unit 50 measures a distance to the subject on the basis of the infrared light signal output from the signal processing unit 30. Further, the distance measurement unit 50 also controls the infrared light emitting unit 60.

The infrared light emitting unit 60 emits infrared light to the subject on the basis of control by the distance measurement unit 50.

[Configuration of Solid-State Imaging Apparatus]

Figure 2:
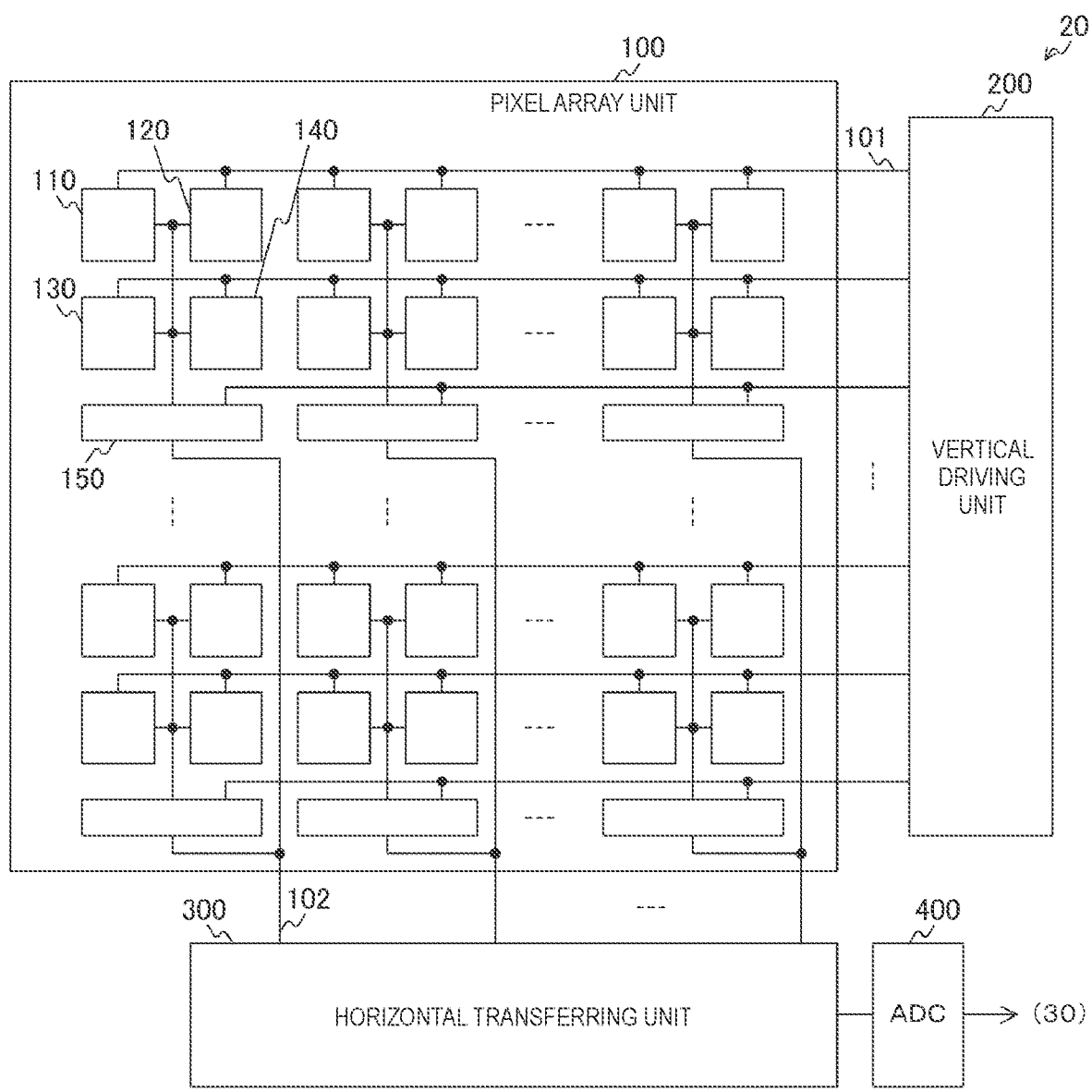
FIG. 2 is a diagram illustrating a configuration example of a solid-state imaging apparatus 20 in the embodiment of the present technology.

FIG. 2 is a diagram illustrating a configuration example of a solid-state imaging apparatus 20 in the embodiment of the present technology. The solid-state imaging apparatus 20 includes a pixel array unit 100, a vertical driving unit 200, a horizontal transferring unit 300, and an analog digital converter (ADC) 400.

The pixel array unit 100 includes a visible light pixel, an infrared light pixel and a signal generating unit, which are arranged in a two-dimensional array. These visible light pixel and infrared light pixel respectively include photoelectric converting units which generate electric charges in accordance with visible light and infrared light. Further, the signal generating unit converts the electric charges generated by the photoelectric converting units into an image signal at a predetermined timing and outputs the image signal. After photoelectric conversion is performed for a predetermined period, by generating an image signal based on the electric charges generated through the photoelectric conversion, it is possible to perform exposure. FIG. 2 illustrates an example where, in the pixel array unit 100, one signal generating unit 150 is disposed for four pixels (pixels 110, 120, 130 and 140). In this case, electric charges generated at the pixels 110, 120, 130 and 140 are transferred to the signal generating unit 150, and an image signal based on these electric charges is output. An image signal based on the electric charge generated by the visible light pixel among these pixels is output as a visible light signal, and an image signal based on the electric charge generated by the infrared light pixel is generated as an infrared light signal.

A signal, or the like, for controlling selection of the above-described pixels is transmitted through a signal line 101. Further, the image signal output from the signal generating unit 150 is transmitted through a signal line 102. These signal lines 101 and 102 are wired in an XY matrix in the pixel array unit 100. That is, one signal line 101 is commonly wired to a pixel 110, or the like, disposed on the same row, and output of the pixel 110, or the like, disposed on the same column is commonly wired to one signal line 102.

The vertical driving unit 200 generates a control signal and outputs the control signal to the pixel array unit 100. The vertical driving unit 200 outputs the control signal to all the signal lines 101 of the pixel array unit 100. The control signal output from the vertical driving unit 200 includes a signal for controlling transfer of the electric charge generated at the above-described pixel 110, or the like, to the signal generating unit 150, and a signal for controlling generation of an image signal at the signal generating unit 150.

The horizontal transferring unit 300 performs processing on the image signal output from the pixel array unit 100. An output signal corresponding to a pixel 110, or the like, corresponding to one row of the pixel array unit 100 is input to the horizontal transferring unit 300 at the same time. The horizontal transferring unit 300 performs parallel-serial conversion on the input image signal and outputs the converted image signal.

The analog digital converter 400 converts (AD converts) the image signal output from the horizontal transferring unit 300 from an analog signal to a digital signal. The AD converted image signal is output to outside the solid-state imaging apparatus 20 via an output buffer (not illustrated).

[Circuit Configuration of Pixel]

Figure 3:
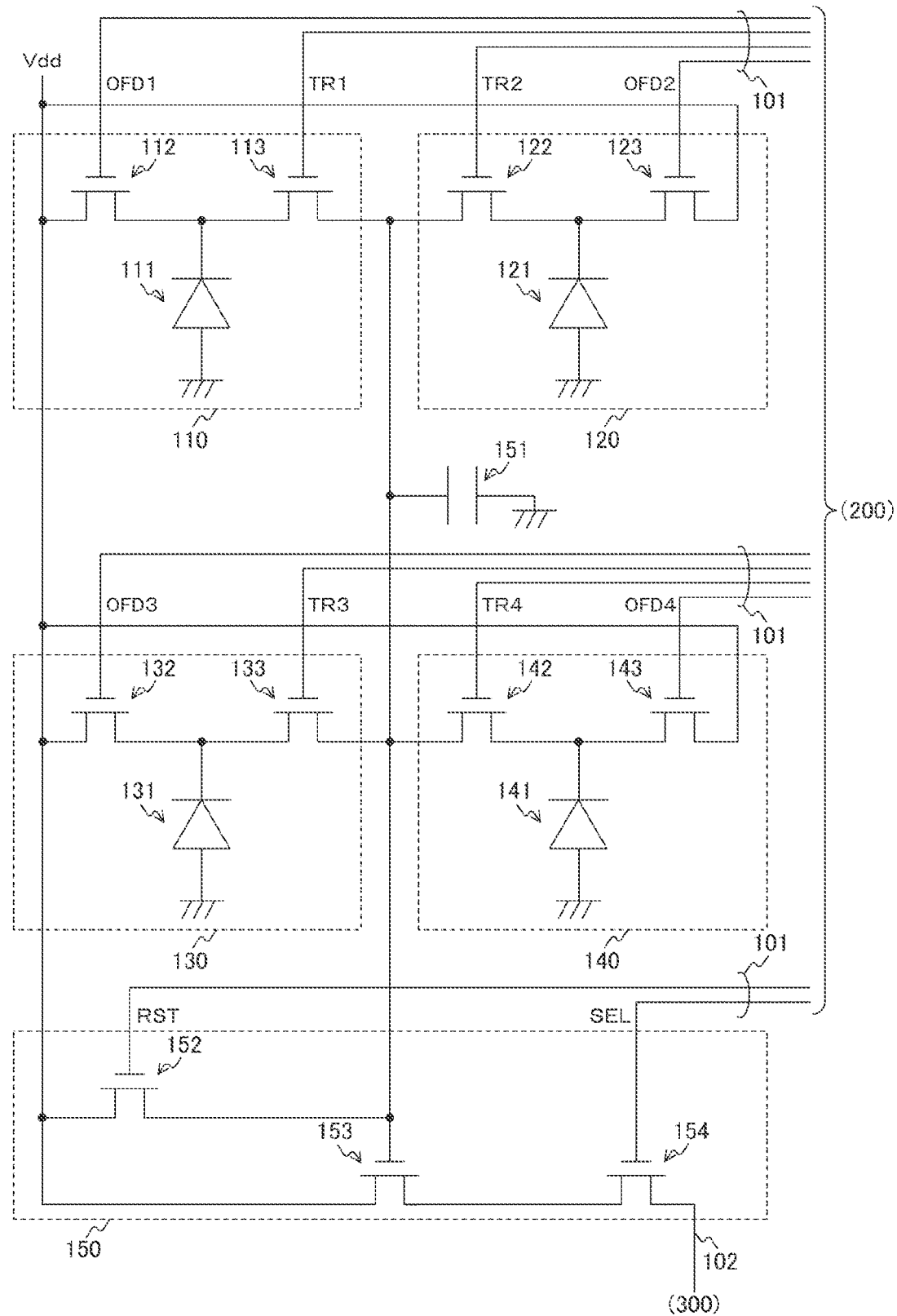
FIG. 3 is a diagram illustrating a configuration example of a pixel in a first embodiment of the present technology.

FIG. 3 is a diagram illustrating a configuration example of a pixel in the first embodiment of the present technology. FIG. 3 illustrates a circuit configuration of pixels 110, 120, 130 and 140, the signal generating unit 150 and the electric charge holding unit 151.

The pixel 110 includes a photoelectric converting unit 111, an electric charge transferring unit 113 and an over flow drain 112. Note that the electric charge transferring unit 113 and the over flow drain 112 are configured with metal oxide semiconductor (MOS) transistors.

In addition to the signal line 101, a power line Vdd and a grounding wire are connected to the pixel 110. Power supply of the pixel 110 is supplied via the power line Vdd and the grounding wire. Further, the signal line 101 is configured with a plurality of signal lines (OFD1 and TR1). The over flow drain 1 (OFD1) is a signal line for transmitting a control signal to the over flow drain 112. The transfer 1 (TR1) is a signal line for transmitting a control signal to the electric charge transferring unit 113. As illustrated in FIG. 3, all of these are connected to a gate of a MOS transistor. When a voltage which is equal to or greater than a threshold between a gate and a source (hereinafter, referred to as an ON signal) is input through these signal lines, the corresponding MOS transistor becomes conductive.

As illustrated in FIG. 3, an anode of the photoelectric converting unit 111 is grounded, and a cathode is grounded to a source of the electric charge transferring unit 113 and a source of the over flow drain 112. A gate and a drain of the over flow drain 112 are respectively connected to the OFD1 and Vdd. A gate of the electric charge transferring unit 113 is connected to the signal line TR1, and a drain is connected to one end of the electric charge holding unit 151.

The photoelectric converting unit 111 generates and accumulates electric charges in accordance with a light receiving amount. The photoelectric converting unit 111 is configured with a photodiode. One of the visible light converting unit for visible light and the infrared light converting unit for infrared light corresponds to the photoelectric converting unit 111. As will be described later, it is possible to constitute the visible light converting unit or the infrared light converting unit by changing characteristics of a color filter disposed for each pixel.

The electric charge transferring unit 113 transfers the electric charge generated by the photoelectric converting unit 111 to the electric charge holding unit 151. The electric charge transferring unit 113 transfers the electric charge by conducting electricity between the photoelectric converting unit 111 and the electric charge holding unit 151.

The over flow drain 112 discharges the electric charge generated by the photoelectric converting unit 111. The over flow drain 112 discharges the electric charge excessively generated at the photoelectric converting unit 111. Further, by conducting electricity between the photoelectric converting unit 111 and the Vdd, it is also possible to discharge all the electric charges accumulated in the photoelectric converting unit 111.

The pixel 120 includes a photoelectric converting unit 121, an electric charge transferring unit 122 and an over flow drain 123.

The signal line 101 connected to the pixel 120 is configured with a plurality of signal lines (an OFD2 and a TR2). The over flow drain 2 (OFD2) is a signal line for transmitting a control signal to the over flow drain 123. The transfer 2 (TR2) is a signal line for transmitting a control signal to the electric charge transferring unit 122. The OFD2 and the TR2 are respectively connected to gates of the over flow drain 123 and the electric charge transferring unit 122. Because other configuration of the pixel 120 is similar to that of the pixel 110, description will be omitted.

The pixel 130 includes a photoelectric converting unit 131, an electric charge transferring unit 133 and an over flow drain 132.

The signal line 101 connected to the pixel 130 is configured with a plurality of signal lines (an OFD3 and a TR3). The over flow drain 3 (OFD3) is a signal line for transmitting a control signal to the over flow drain 132. The transfer 3 (TR3) is a signal line for transmitting a control signal to the electric charge transferring unit 133. The OFD3 and the TR3 are respectively connected to gates of the over flow drain 132 and the electric charge transferring unit 133. Because other configuration of the pixel 130 is similar to that of the pixel 110, description will be omitted.

The pixel 140 includes a photoelectric converting unit 141, an electric charge transferring unit 142 and an over flow drain 143.

The signal line 101 connected to the pixel 140 is configured with a plurality of signal lines (an OFD4 and a TR4). The over flow drain 4 (OFD4) is a signal line for transmitting a control signal to the over flow drain 143. The transfer 4 (TR4) is a signal line for transmitting a control signal to the electric charge transferring unit 142. The OFD4 and the TR4 are respectively connected to gates of the over flow drain 143 and the electric charge transferring unit 142. Because other configuration of the pixel 140 is similar to that of the pixel 110, description will be omitted.

The electric charge holding unit 151 holds the electric charges transferred from the pixels 110, 120, 130 and 140.

The signal generating unit 150 generates a signal in accordance with the signal held in the electric charge holding unit 151. The signal generating unit 150 includes MOS transistors 152 to 154.

The signal line 101, the signal line 102, the power line Vdd and the grounding wire are connected to the signal generating unit 150. The signal line 101 is configured with a plurality of signal lines (an RST and an SEL). The reset (RST) is a signal line for transmitting a control signal to the MOS transistor 152. The select (SEL) is a signal line for transmitting a control signal to the MOS transistor 154. The signal line 102 is a signal line for transmitting a signal generated by the signal generating unit 150.

As illustrated in FIG. 3, drains of the MOS transistors 152 and 153 are connected to the Vdd. A source of the MOS transistor 152 and a gate of the MOS transistor 153 are connected to one end of the electric charge holding unit 151 to which drains of the above-mentioned electric charge transferring units 113, 122, 133 and 142 are connected. The other end of the electric charge holding unit 151 is grounded. A source of the MOS transistor 153 is connected to a drain of the transistor 154, and a source of the MOS transistor 154 is connected to the signal line 102. Gates of the MOS transistor 152 and the MOS transistor 154 are respectively connected to the signal lines RST and SEL.

The MOS transistor 153 is a MOS transistor which generates a signal in accordance with the electric charge held in the electric charge holding unit 151. The MOS transistor 154 is a MOS transistor which outputs the signal generated by the MOS transistor 153 to the signal line 102 as an image signal. Note that a constant current power supply which is not illustrated is connected to the signal line 102, and constitutes a source follower circuit with the MOS transistor 153. The constant current power supply is disposed in the horizontal transferring unit 300 described with reference to FIG. 2.

The MOS transistor 152 is a MOS transistor which discharges the electric charge held in the electric charge holding unit 151. The MOS transistor 152 discharges the electric charge by conducting electricity between the electric charge holding unit 151 and the Vdd.

[Operation at Pixel]

Operation of the pixel illustrated in FIG. 3 will be described using an example of the pixel 110. First, when an ON signal is input from an OFG, the over flow drain 112 becomes conductive, and the Vdd is applied to a cathode of the photoelectric converting unit 111. By this means, the electric charge accumulated in the photoelectric converting unit 111 is discharged. Then, an electric charge in accordance with the light receiving amount is newly generated and accumulated in the photoelectric converting unit 111.

When an ON signal is input from the TR1 after a predetermined exposure period has elapsed, the electric charge transferring unit 113 becomes conductive. By this means, a state between the photoelectric converting unit 111 and the electric charge holding unit 151 becomes a conductive state, and the electric charge accumulated in the photoelectric converting unit 111 is transferred to the electric charge holding unit 151 and held. Because the gate of the MOS transistor 153 is connected to the electric charge holding unit 151, a signal based on the electric charge held in the electric charge holding unit 151 is generated. In this event, if the ON signal is input from the SEL, the MOS transistor 154 becomes conductive, and a signal generated by the MOS transistor 153 is output to the signal line 102.

Then, when the ON signal is input from the RST and the MOS transistor 152 becomes conductive, the Vdd is applied to the electric charge holding unit 151, and the held electric charge is discharged.

Sources of the electric charge transferring units 113, 122, 133 and 142 are commonly connected to the electric charge holding unit 151. Therefore, by controlling the TR1 to the TR4 which control the electric charge transferring units 113, 122, 133 and 142, it is possible to generate and output an image signal based on the electric charge generated at a desired pixel among the pixels 110, 120, 130 and 140.

As described above, the operation of each pixel is not different from each other. However, by changing characteristics of the photoelectric converting units (photoelectric converting units 111, 121, 131 and 141), it is possible to use each pixel as a visible light pixel or an infrared light pixel. Specifically, by changing a color filter disposed at each pixel, it is possible to change characteristics of the photoelectric converting unit. This color filter is a filter which selects light to be incident on the photoelectric converting unit. By disposing a color filter which transmits only visible light, it is possible to make the photoelectric converting unit a visible light converting unit which deals with visible light and make a pixel having the visible light converting unit a visible light pixel. Meanwhile, in the case where a color filter which transmits only infrared light is disposed, it is possible to make the photoelectric converting unit an infrared light converting unit which deals with infrared light and make a pixel having the infrared light converting unit an infrared light pixel. Disposition of the color filter will be described in detail later.

Here, combination of one electric charge holding unit and a plurality of photoelectric converting units commonly connected to the electric charge holding unit will be referred to as a converting block. In FIG. 3, an example is illustrated where the electric charge holding unit 151 and four photoelectric converting units (photoelectric converting units 111, 121, 131 and 141) constitute the converting block. Among the converting blocks, a converting block configured with a plurality of visible light converting units will be referred to as a visible light converting block. Further, a converting block configured with a plurality of infrared light converting units will be referred to as an infrared light converting block. Still further, the electric charge holding unit in the visible light converting block will be referred to as a visible light electric charge holding unit, and the electric charge holding unit in the infrared light converting block will be referred to as an infrared light electric charge converting unit. As will be described later, the visible light electric charge holding unit exclusively holds electric charges respectively generated by a plurality of visible light converting units in different periods. On the other hand, the infrared light electric charge holding unit collectively holds the electric charges respectively generated by a plurality of infrared light converting units at the same time. The signal generating unit 150 which generates a signal in accordance with the electric charge held in the infrared light electric charge holding unit will be referred to as an infrared light signal generating unit.

[Arrangement of Pixels]

Figure 4:
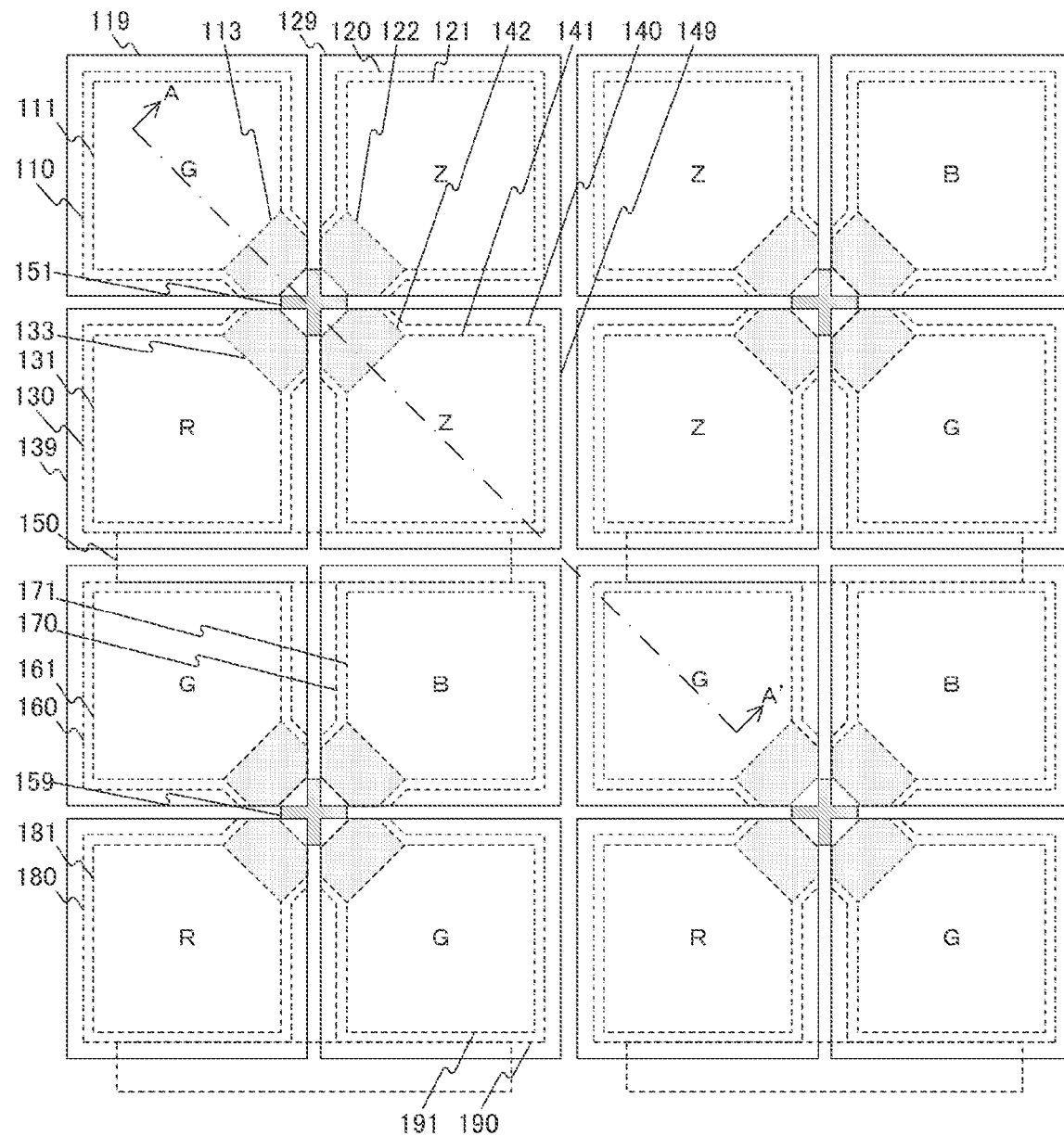
FIG. 4 is a diagram illustrating an arrangement example of pixels in the first embodiment of the present technology.

FIG. 4 is a diagram illustrating an arrangement example of pixels in the first embodiment of the present technology. FIG. 4 is a plan view in which four converting blocks are arranged. Further, description will be provided while an upper left converting block in FIG. 4 is associated with pixels, or the like, described with reference to FIG. 3. However, description will be omitted for the over flow drains 112, 123, 132 and 143. As illustrated in FIG. 4, the electric charge holding unit 151 is disposed at the center of the pixels 110, 120, 130 and 140. The electric charge transferring units 113, 122, 133 and 142 of the respective pixels are respectively disposed adjacent to the electric charge holding unit 151, and the photoelectric converting units 111, 121, 131 and 141 are disposed adjacent to these electric charge transferring units. The signal generating unit 150 is disposed adjacent to each of these converting blocks. If the photoelectric converting units 111, 121, 131 and 141 illustrated in FIG. 4 are irradiated with light from the subject, photoelectric conversion is performed. That is, in the photoelectric converting unit 111, or the like, an area illustrated in FIG. 4 corresponds to a light receiving face on which visible light, or the like, is received.

Further, color filters 119, 129, 139 and 149 are respectively disposed at the pixels. Characters of R, G, B and Z described at the respective pixels indicate types of the color filters. Here, color filters 129 and 149 of the pixels 120 and 140 at which a character of Z is described are color filters which transmit infrared light. Therefore, the photoelectric converting units 111 and 131 and 161, 171, 181 and 191 in a lower left converting block in FIG. 4 correspond to the visible light converting units, and the pixels 110, 130, 160, 170, 180 and 190 having these correspond to visible light pixels. Meanwhile, the photoelectric converting units 121 and 141 correspond to infrared light converting units, and the pixels 120 and 140 having these correspond to infrared light pixels. As is clear from FIG. 4, a light receiving face of the infrared light converting unit has substantially the same size as the size of the light receiving face of the visible light converting unit.

Further, an upper left converting block in FIG. 4 includes two infrared light converting units (the photoelectric converting units 121 and 141), two visible light converting units (the photoelectric converting units 111 and 131) and the infrared light electric charge holding unit (the electric charge holding unit 151), and corresponds to the infrared light converting block. Further, the signal generating unit 150 disposed adjacent to this converting block corresponds to the infrared light signal generating unit which generates a signal in accordance with the electric charge held in the infrared light electric charge holding unit (the electric charge holding unit 151). In a similar manner, an upper right converting block in FIG. 4 also corresponds to the infrared light converting block. Meanwhile, a lower left converting block in FIG. 4 includes four visible light converting units (the photoelectric converting units 161, 171, 181 and 191) and the visible light electric charge holding unit (the electric charge holding unit 159), and corresponds to the visible light converting block. In a similar manner, a lower right converting block in FIG. 4 also corresponds to the visible light converting block. In this visible light converting block, R, G and B pixels are disposed in a Bayer array.

[Cross-Section of Pixel]

Figure 5:
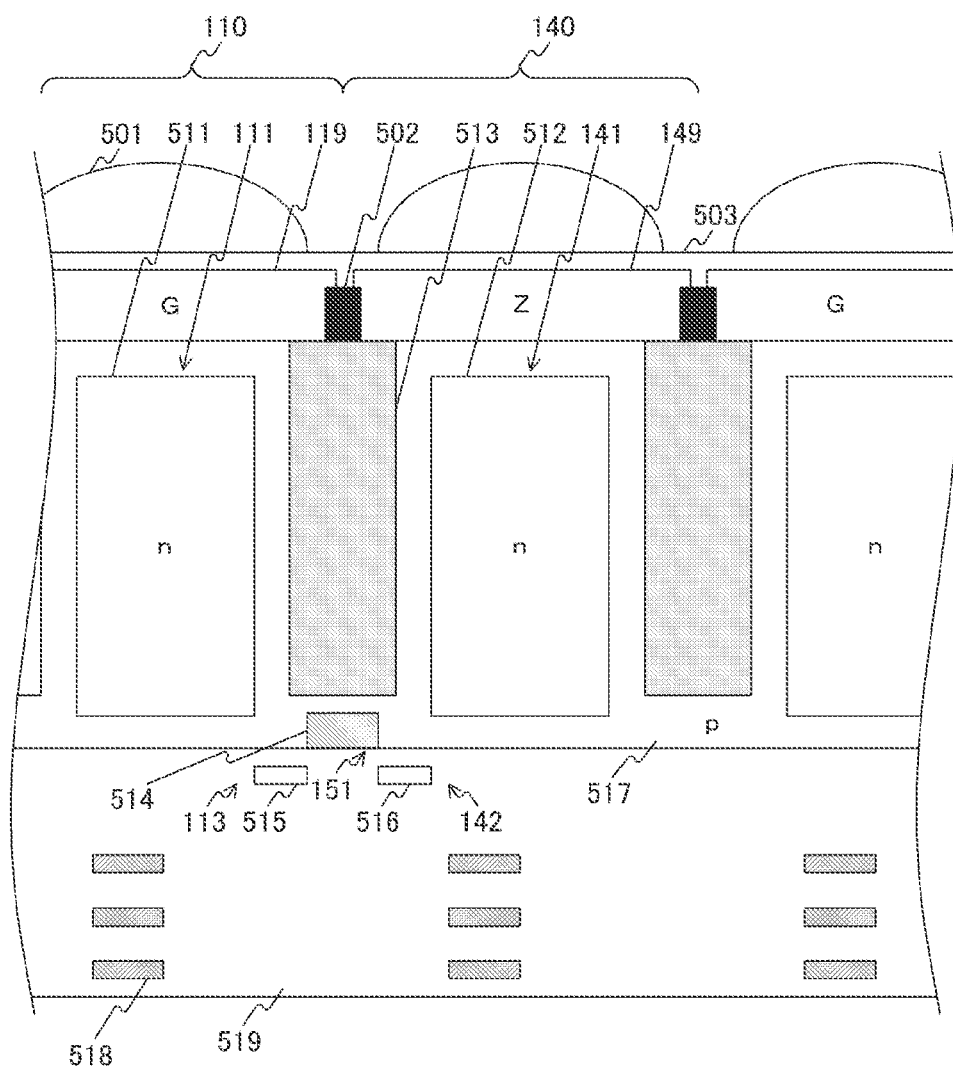
FIG. 5 is a schematic diagram illustrating a configuration example of a pixel in the first embodiment of the present technology.

FIG. 5 is a schematic diagram illustrating a configuration example of the pixel in the first embodiment of the present technology. FIG. 5 is a cross-section diagram along line A-A' in FIG. 4. Description will be provided using an example of the pixels 110 and 140. The photoelectric converting units 111 and 141 in FIG. 5 are respectively configured with a p-type semiconductor region 517 and n-type semiconductor regions 511 and 512 embedded inside the p-type semiconductor region 517. Photoelectric conversion is performed at a pn junction formed at interface of these semiconductor regions, and an electric charge in accordance with a light receiving amount is generated. In this event, an electron among the generated electric charge is accumulated in the n-type semiconductor regions 511 and 512. The color filter 119 or 149, a flattening film 503, and a micro lens 501 are sequentially disposed over the photoelectric converting unit. The flattening film 503 flattens a surface of the pixel. The micro lens 501 is a lens which makes light radiated to the pixel focus on the photoelectric converting unit. A light shielding film 502 is disposed between the color filters 119 and 149. The light shielding film 502 shields light obliquely incident from the adjacent pixels.

Further, a separating region 513 is disposed between pixels in the p-type semiconductor region 517. The separating region 513 is a region which separates the pixels and shields light obliquely incident from the adjacent pixels. The electric charge holding unit 151 is disposed at an intermediate portion of the pixel 110 and the pixel 140. The electric charge holding unit 151 is configured with the n-type semiconductor region 514. The n-type semiconductor region 514 is a region which is referred to as a floating diffusion (FD), and to which the signal generating unit 150 (not illustrated) is connected. As illustrated in FIG. 5, because the electric charge holding unit 151 is disposed immediately below the separating region 513, light is shielded by the separating region 513. The electric charge transferring units 113 and 142 are disposed between the electric charge holding unit 151 and the photoelectric converting units 111 and 141. Gate electrodes 515 and 516 are respectively disposed at the electric charge transferring units 113 and 142. When an ON voltage is applied to the gate electrodes, the p-type semiconductor region 517 between the photoelectric converting unit 111 or 141 and the electric charge holding unit 151 becomes conductive, and the electric charge transferring units 113 and 142 become conductive.

An interlayer insulating layer 519 and a wiring layer 518 are disposed below the p-type semiconductor region 517. The wiring layer 518 transmits signals of the pixels 110 and 140 and constitutes the signal lines 101 and 102 described with reference to FIG. 3. The interlayer insulating layer 519 insulates the wiring layers 518 from each other.

In this manner, because light to the electric charge holding unit 151 in FIG. 5 is shielded by the separating region 513, a dark current is reduced.

[Principle of Distance Measurement]

Figure 6:
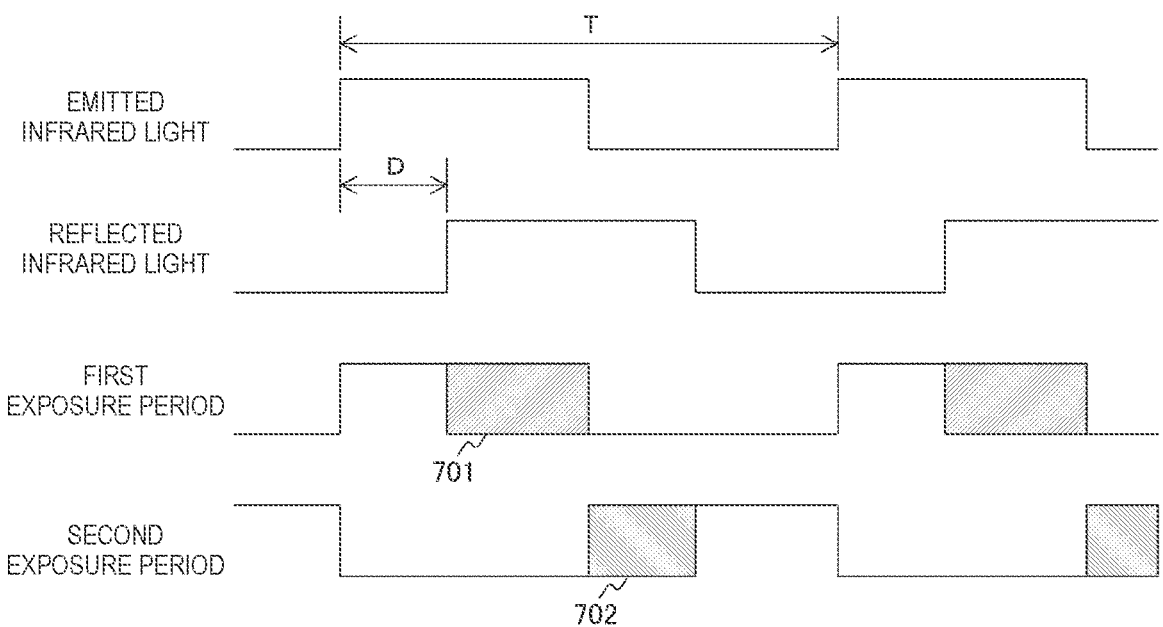
FIG. 6 is a diagram illustrating a distance measurement method in the first embodiment of the present technology.

FIG. 6 is a diagram illustrating a distance measurement method in the first embodiment of the present technology. The emitted infrared light in FIG. 6 has a waveform of infrared light emitted from the infrared light emitting unit 60. Further, the reflected infrared light has a waveform of infrared light obtained by the emitted infrared light being reflected by the subject and incident on the solid-state imaging apparatus 20. A Z pixel of the solid-state imaging apparatus 20 receives the reflected infrared light, converts the reflected infrared light into an infrared light signal and performs exposure. In this event, an infrared light signal is generated while different exposure periods are set using two Z pixels. A first exposure period and a second exposure period indicate relationship of the exposure periods set for the two Z pixels, and a period of a binarized value "1" of the waveform corresponds to the exposure period.

As illustrated in FIG. 6, a pulse width of the emitted infrared light is modulated to 50% duty and the emitted infrared light is emitted from the infrared light emitting unit 60. Meanwhile, the reflected infrared light has a waveform in which a phase is delayed with respect to the emitted infrared light. D in FIG. 6 indicates the delay of the phase. This corresponds to a time period from when the emitted infrared light is reflected by the subject until when the emitted infrared light reaches the solid-state imaging apparatus 20. By measuring this time period, it is possible to calculate a distance to the subject.

As the first exposure period in FIG. 6, an exposure period in synchronization with the emitted infrared light is set. Meanwhile, as the second exposure period, an exposure period in which a phase is shifted by 180° with respect to the emitted infrared light is set. In the first exposure period, photoelectric conversion is performed on reflected light in a period 701 in FIG. 6. In the second exposure period, photoelectric conversion is performed on reflected light in a period 702 in FIG. 6. A ratio of the period 701 and the period 702 changes on the basis of the delay of the phase. That is, as the phase delay D becomes larger, the period 701 becomes shorter, and the period 702 becomes longer. Therefore, by calculating a ratio of the infrared light signals generated by the Z pixels in the first exposure period and the second exposure period, it is possible to calculate the phase delay D.

Here, when the infrared light signals of the Z pixels for which the first and the second exposure periods are set are respectively S1 and S2, and a cycle of the emitted infrared light is T, D can be calculated using the following equation.

$$D = S2 \times (S1 + S2) \times T/2$$

A distance L to the subject can be calculated using the following equation.

$$L = D \times c/2 \quad \text{(equation 1)}$$

where c is light speed. For example, in the case where a distance to the subject is 10 m, D is approximately 33 ns. In this case, by setting T at, for example, 100 ns (a modulation frequency of the emitted infrared light is 10 MHz), it is possible to measure the distance. Control of output of the pulse-modulated infrared light to the infrared light emitting unit 60 and calculation of the distance are performed by the distance measurement unit 50 described with reference to FIG. 1.

In this manner, it is possible to calculate a distance to the subject by using two Z pixels. Note that, because the reflected infrared light attenuates in the process of propagation, it is necessary to improve a level of the infrared light signal by repeatedly emitting infrared light and accumulating the electric charges generated by the Z pixels.

[Operation of Solid-State Imaging Apparatus]

Figure 7:
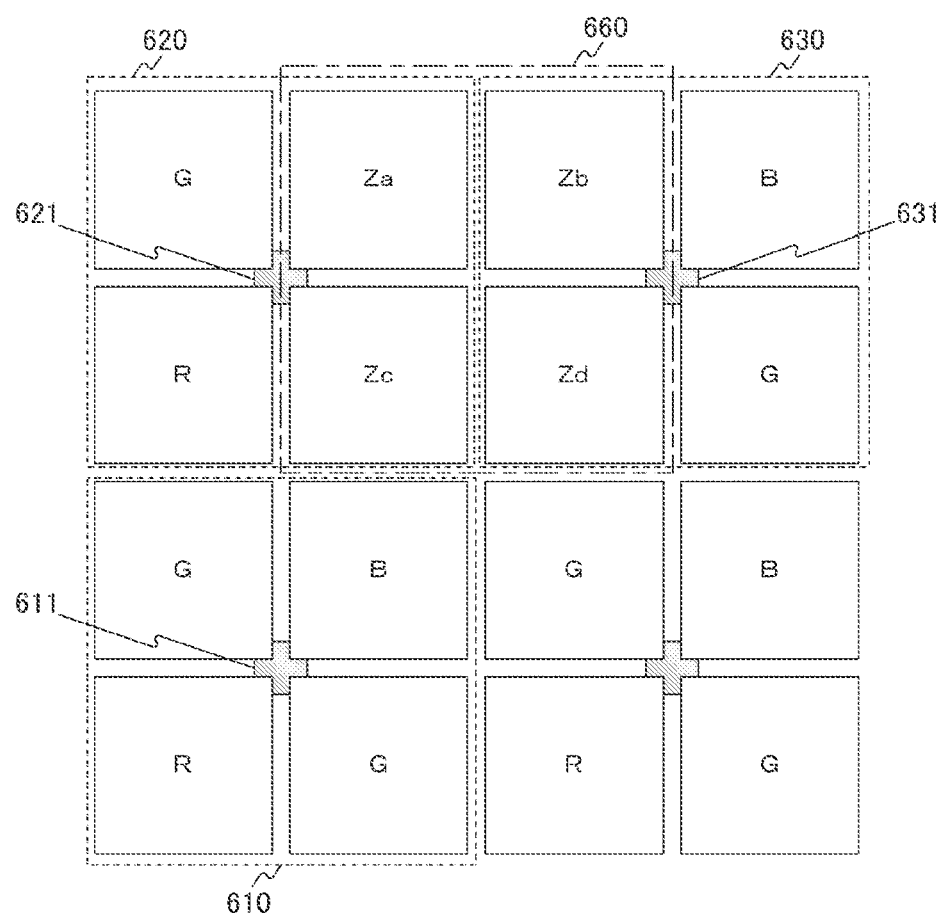
FIG. 7 is a diagram illustrating an infrared light converting block in the first embodiment of the present technology.

FIG. 7 is a diagram illustrating the infrared light converting block in the first embodiment of the present technology. Arrangement of the pixels in FIG. 7 is similar to arrangement of the pixels described with reference to FIG. 4. A distance is measured by a pixel group 660 formed with Z pixels (Za, Zb, Zc and Zd) disposed in two infrared light converting blocks 620 and 630 at an upper side in FIG. 7. Za and Zc, and Zb and Zd belong to different infrared light converting blocks, and are connected to different infrared light electric charge holding units 621 and 631. A distance is measured by applying the first exposure period and the second exposure period descried with reference to FIG. 6 to Za and Zc, and Zb and Zd. Meanwhile, the visible light converting block 610 in FIG. 7 includes a visible light electric charge holding unit 611. The visible light converting block 610 is provided for performing imaging using visible light.

Figure 8:
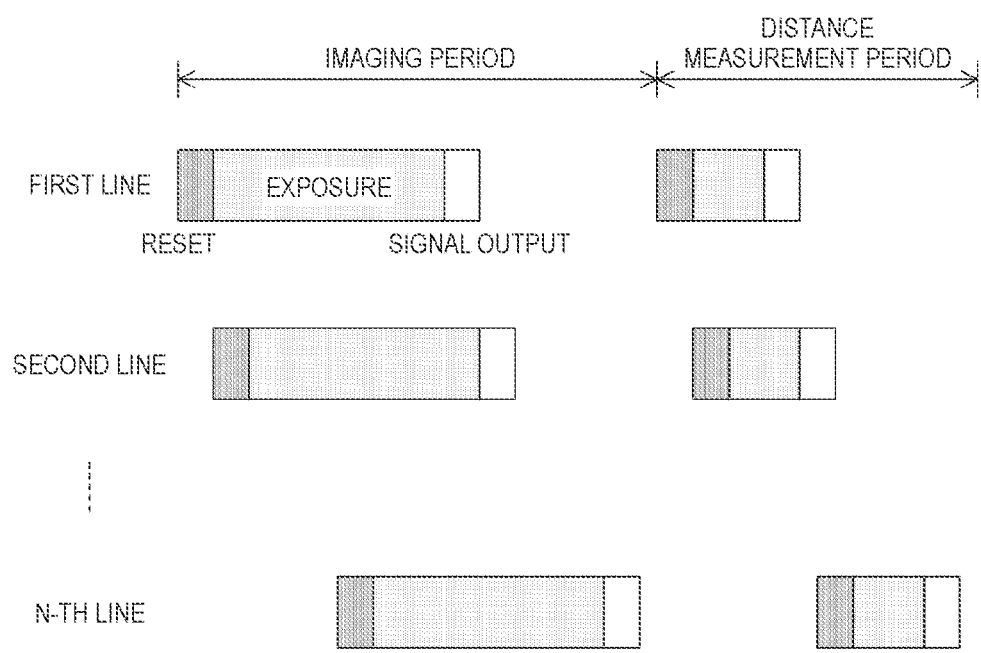
FIG. 8 is a diagram illustrating relationship between an imaging period and a distance measurement period in the first embodiment of the present technology.

FIG. 8 is a diagram illustrating relationship between an imaging period and a distance measurement period in the first embodiment of the present technology. As illustrated in FIG. 8, the solid-state imaging apparatus 20 measures a distance to the subject after performing imaging for generating an image signal of the subject. The imaging period and the distance measurement period which are periods during which imaging and distance measurement are performed are alternately repeated. In the imaging period, reset, exposure and signal output are sequentially executed in the visible light pixel starting from a first line. Here, reset is discharging of the electric charge accumulated in the electric charge converting unit. Reset is performed on all the pixels included in one line, and exposure is started. After a predetermined exposure period has elapsed, an image signal based on the electric charge generated through photoelectric conversion is generated and output. By this means, exposure in the line is finished. A frame which is an image signal corresponding to one screen can be obtained by performing these on all the lines. Then, the period shifts to the distance measurement period.

In the distance measurement period, reset, exposure and signal output are sequentially executed in the infrared light pixel starting from a first line. In this event, an infrared light signal for distance measurement is generated and output.

[Imaging Method]

Figure 9:
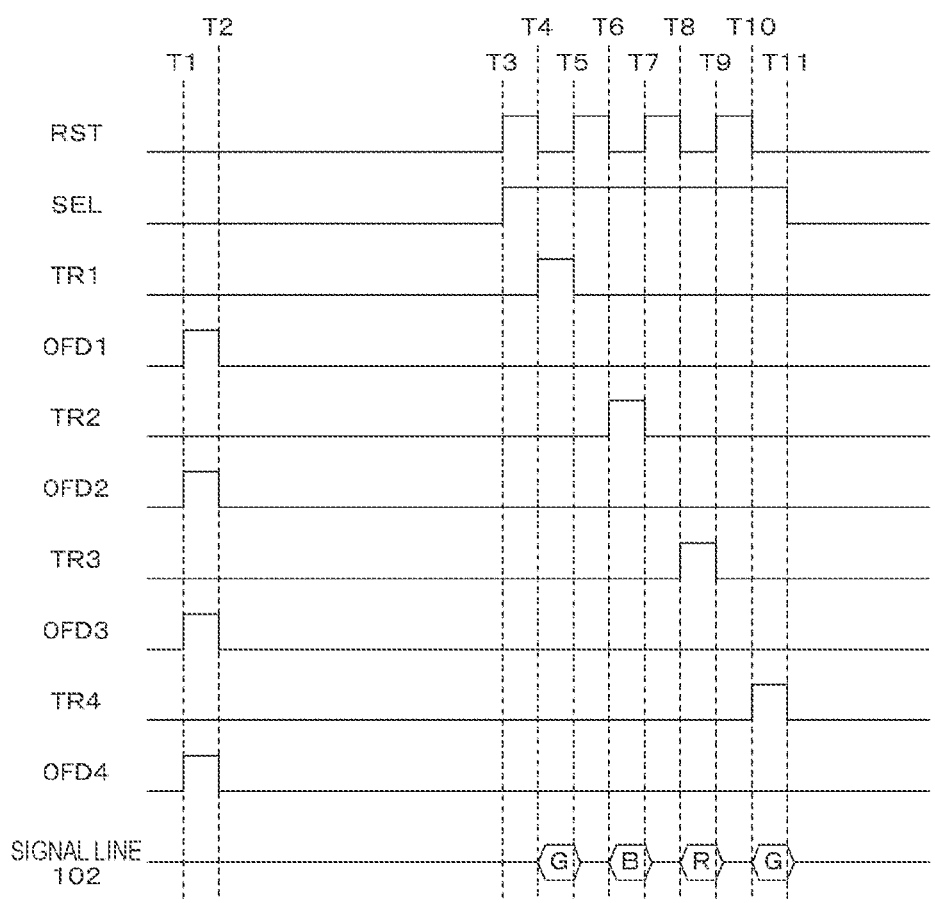
FIG. 9 is a diagram illustrating an imaging method in the first embodiment of the present technology.

FIG. 9 is a diagram illustrating an imaging method in the first embodiment of the present technology. FIG. 9 illustrates an imaging method at a visible light converting block 610 and illustrates relationship between an input signal and an output signal. The signals illustrated in FIG. 9 correspond to the signals described with reference to FIG. 3. Among these signals, in the input signal, a period in which a value of binarized waveform "1" corresponds to input of an ON signal. Further, description will be provided using reference numerals of components (such as the electric charge transferring unit and the over flow drain) which are the same reference numerals as those of the components described with reference to FIG. 3, other than the visible light electric charge holding unit 611.

First, ON signals are input to the OFD1 to OFD4 to make the over flow drains 112 123, 132 and 143 conductive (T1). By this means, electric charges accumulated in the photoelectric converting units 111, 121, 131 and 141 are discharged, and reset is executed. After reset is finished, input of the ON signals to the OFD1 to OFD4 is stopped to make the over flow drains 112, 123, 132 and 143 non-conductive (T2). By this means, electric charges obtained by photoelectric conversion are newly generated and accumulated in the photoelectric converting units 111, 121, 131 and 141. That is, exposure is started.

After a predetermined exposure period has elapsed, an ON signal is input to the RST to make the MOS transistor 152 of the signal generating unit 150 conductive (T3). By this means, the electric charge in the visible light electric charge holding unit 611 is discharged. At the same time, an ON signal is input to the SEL to make the MOS transistor 154 of the signal generating unit 150 conductive. By this means, when an electric charge is transferred to and held in the visible light electric charge holding unit 611 in subsequent operation, a visible light signal based on this electric charge is output to the signal line 102.

Subsequently, input of the ON signal to the RST is stopped to make the MOS transistor 152 non-conductive, and an ON signal is input to the TR1 to make the electric charge transferring unit 113 of the pixel 110 conductive (T4). By this means, the electric charge accumulated in the photoelectric converting unit 111 is transferred to the visible light electric charge holding unit 611. Further, a signal "G" based on the electric charge transferred to the visible light electric charge holding unit 611 is output to the signal line 102. The signal corresponds to a visible light signal at the pixel 110 (an image signal corresponding to green light). An exposure period at the pixel 110 is stopped by the electric charge accumulated in the photoelectric converting unit 111 being transferred to the visible light electric charge holding unit 611, and the processing shifts to signal output described with reference to FIG. 8.

Subsequently, input of the ON signal to the TR1 is stopped, and an ON signal is input to the RST (T5). By this means, the electric charge held in the visible light electric charge holding unit 611 is discharged, and signal output at the pixel 110 is finished.

Subsequently, input of the ON signal to the RST is stopped, and an ON signal is input to the TR2 to make the electric charge transferring unit 122 of the pixel 120 conductive (T6). By this means, the electric charge accumulated in the photoelectric converting unit 121 is transferred to the visible light electric charge holding unit 611, and a signal "B" based on the transferred electric charge is output to the signal line 102. This signal corresponds to a visible light signal (an image signal corresponding to blue light) in the pixel 120. Then, input of the ON signal to the TR2 is stopped, and an ON signal is input to the RST (T7). By this means, the electric charge in the visible light electric charge holding unit 611 is discharged and signal output at the pixel 120 is finished.

Subsequently, input of the ON signal to the RST is stopped, and an ON signal is input to the TR3 to make the electric charge transferring unit 133 of the pixel 130 conductive (T8). By this means, the electric charge accumulated in the photoelectric converting unit 131 is transferred to the visible light electric charge holding unit 611, and a signal "R" based on the transferred electric charge is output to the signal line 102. This signal corresponds to a visible light signal (an image signal corresponding to red light) at the pixel 130. Then, input of the ON signal to the TR3 is stopped, and an ON signal is input to the RST (T9). By this means, the electric charge of the visible light electric charge holding unit 611 is discharged, and signal output at the pixel 130 is finished.

Subsequently, input of the ON signal to the RST is stopped, and an ON signal is input to the TR4 to make the electric charge transferring unit 142 of the pixel 140 conductive (T10). By this means, the electric charge accumulated in the photoelectric converting unit 141 is transferred to the visible light electric charge holding unit 611, and a signal "G" based on the transferred electric charge is output to the signal line 102. This signal corresponds to a visible light signal (an image signal corresponding to green light) at the pixel 140. Then, input of the ON signals to the TR4 and the SEL is stopped (T11). By this means, signal output at the pixel 140 is finished.

After processing described with reference to FIG. 9 is performed on all lines, an imaging period for one screen is finished. In this manner, in the visible light converting block 610, electric charges respectively generated by the four photoelectric converting units 111, 121, 131 and 141 are exclusively held in the visible light electric charge holding unit 611 in different periods (T4, T6, T8 and T10). That is, electric charges respectively generated by a plurality of visible light converting units are exclusively held in the visible light electric charge holding unit.

[Distance Measurement]

Figure 10:
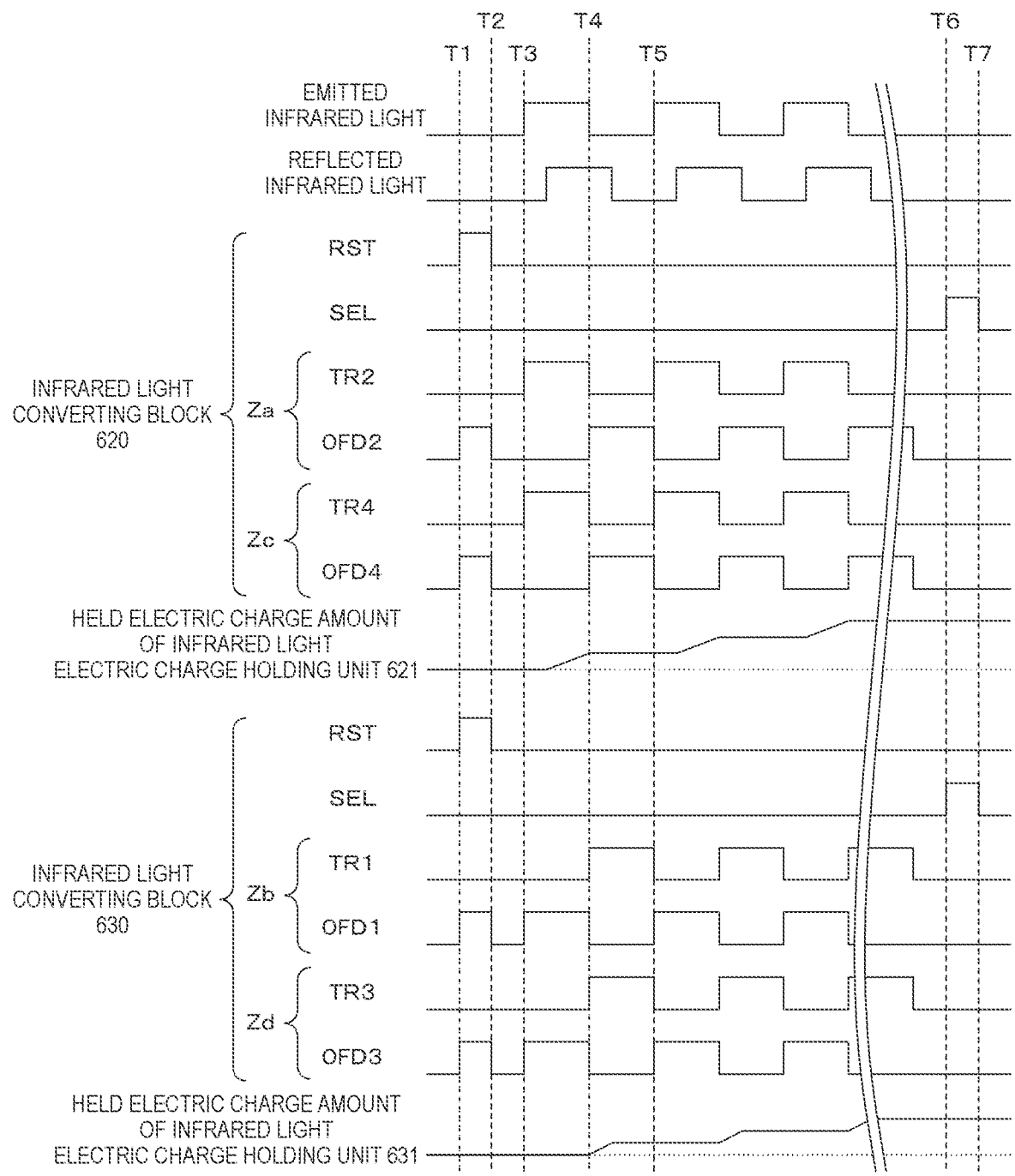
FIG. 10 is a diagram illustrating a distance measurement method in the first embodiment of the present technology.

FIG. 10 is a diagram illustrating a distance measurement method in the first embodiment of the present technology. FIG. 10 illustrates a distance measurement method in a pixel group 660. FIG. 10 illustrates relationship among an input signal at a Z pixel of the pixel group 660, emitted infrared light, reflected infrared light, and held electric charge amounts at the infrared light electric charge holding units 621 and 631. Note that the signals of the infrared light converting blocks 620 and 630 described with reference to FIG. 7 correspond to signals described with reference to FIG. 3. That is, among the Z pixels of the pixel group 660, signals of Za and Zc respectively correspond to signals at the pixels 120 and 140 in FIG. 3. In a similar manner, signals of Zb and Zd respectively correspond to signals at the pixels 110 and 130 in FIG. 3. Description will be provided using reference numerals of components which are the same reference numerals as those of the components described with reference to FIG. 3, other than the infrared light electric charge holding units 621 and 631.

First, ON signals are input to the RSTs of the infrared light converting blocks 620 and 630 to make the MOS transistor 152 conductive. At the same time, ON signals are input to the OFD2 and the OFD4 of the infrared light converting block 620 and the OFD1 and the OFD3 of the infrared light converting block 630 to make the over flow drains 123, 143, 112 and 132 conductive (T1). By this means, the electric charges held in the infrared light electric charge holding units 621 and 631 are discharged. Further, the electric charges accumulated in the photoelectric converting units 121 and 141 of the infrared light converting block 620 and the photoelectric converting units 111 and 131 of the infrared light converting block 630 are discharged, and reset is performed. After reset is finished, the above-described input of the ON signals to the RST and the OFD is finished (T2).

Subsequently, infrared light is emitted from the infrared light emitting unit 60, ON signals are input to the TR2 and the TR4 of the infrared light converting block 620, and ON signals are input to the OFD1 and the OFD3 of the infrared light converting block 630 (T3). By this means, in the infrared light converting block 620, the electric charge transferring units 122 and 142 become conductive, and electric charges generated on the basis of reflected infrared light at the photoelectric converting units 121 and 141 are held in the infrared light electric charge holding unit 621. Meanwhile, in the infrared light converting block 630, the over flow drains 112 and 132 become conductive, and the photoelectric converting units 111 and 131 are reset.

Subsequently, emission of infrared light from the infrared light emitting unit 60 is stopped, and input of the ON signals to the TR2 and the TR4 of the infrared light converting block 620 and the OFD1 and the OFD3 of the infrared light converting block 630 is stopped. At the same time, ON signals are input to the OFD1 and the OFD3 of the infrared light converting block 620 and the TR2 and the TR4 of the infrared light converting block 630 (T4). By this means, in the infrared light converting block 620, the over flow drains 123 and 143 become conductive, and the photoelectric converting units 121 and 141 are reset. Meanwhile, in the infrared light converting block 630, the electric charge transferring units 113 and 133 become conductive, and electric charges generated on the basis of reflected infrared light at the photoelectric converting units 111 and 131 are held in the infrared light electric charge holding unit 631.

Subsequently, input of the ON signals to the OFD1 and the OFD3 of the infrared light converting block 620 and the TR2 and the TR4 of the infrared light converting block 630 is stopped (T5). Thereafter, operation of T3 and T4 is repeated the predetermined number of times. By this means, electric charges based on reflected infrared light are accumulated in the infrared light electric charge holding units 621 and 631.

Subsequently, ON signals are input to the SELs of the infrared light converting blocks 620 and 630 (T6). By this means, the MOS transistors 154 of the infrared light converting blocks 620 and 630 become conductive, and infrared light signals based on the electric charges held in the infrared light electric charge holding units 621 and 631 are respectively output. Then, input of the ON signals to the SELs of the infrared light converting blocks 620 and 630 is stopped, and the distance measurement period is finished (T7).

As described above, photoelectric conversion in synchronization with emitted infrared light is performed at the Za and the Zc of the infrared light converting block 620. That is, the first exposure period described with reference to FIG. 6 is set at the Za and the Zc. Meanwhile, in the Zb and the Zd of the infrared light converting block 630, photoelectric conversion is performed in a period in which a phase is shifted by 180° with respect to the emitted infrared light. That is, the second exposure period described with reference to FIG. 6 is applied to the Zb and the Zd. The distance measurement unit 50 calculates a distance to the subject on the basis of the infrared light signals from these Z pixels.

In this manner, in the infrared light converting block 620, the electric charge transferring units 122 and 142 become conductive at the same time, and electric charges respectively generated by the two photoelectric converting units 121 and 141 are collectively held in the infrared light electric charge holding unit 621 at the same time (T3). In a similar manner, in the infrared light converting block 630, the electric charge transferring units 113 and 133 become conductive at the same time, and electric charges respectively generated by the two photoelectric converting units 111 and 131 are collectively held in the infrared light electric charge holding unit 631 at the same time (T4). That is, electric charges respectively generated by a plurality of infrared light converting units are collectively held in the infrared light electric charge holding unit at the same time. Note that the electric charge transferring units 122 and 142 are an example of an infrared light electric charge transferring unit recited in the claims.

Meanwhile, in the G pixel and the R pixel of the infrared light converting block 620, a visible light signal is generated by the imaging method described with reference to FIG. 9 being applied. That is, electric charges respectively generated by the visible light converting units included in these pixels are exclusively held in the infrared light electric charge holding unit 621 in different periods. Electric charges are similarly held also in the B pixel and the G pixel of the infrared light converting block 630.

[Distance Measurement Procedure]

Figure 11:
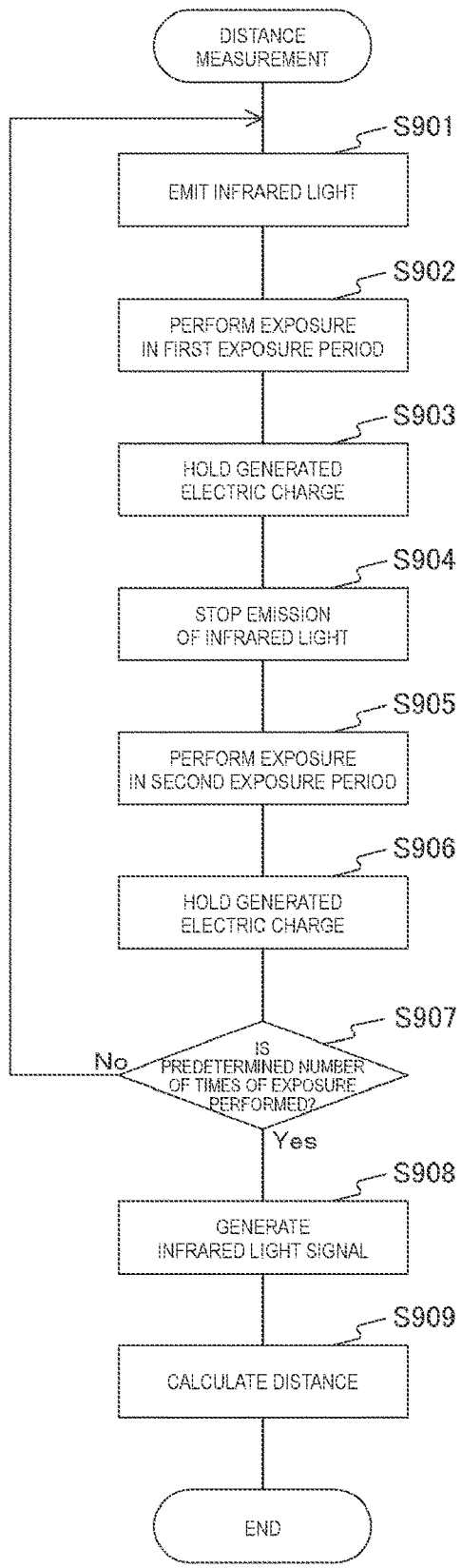
FIG. 11 is a diagram illustrating an example of processing procedure of distance measurement in the first embodiment of the present technology.

FIG. 11 is a diagram illustrating an example of distance measurement processing procedure in the first embodiment of the present technology. The processing in FIG. 11 is executed in the imaging system 1 when a distance is measured. Procedure of the processing will be described using symbols illustrated in FIG. 7.

First, the infrared light emitting unit 60 emits infrared light to the subject (step S901). Then, exposure of infrared light is performed by the infrared light converting block 620 for which the first exposure period is set (step S902). After a predetermined exposure period has elapsed, the electric charge generated by the exposure is held in the infrared light electric charge holding unit 621 (step S903). Emission of the infrared light by the infrared light emitting unit 60 is stopped (step S904). Then, exposure of infrared light is performed by the infrared light converting block 630 for which the second exposure period is set (step S905), and the generated electric charge is held in the infrared light electric charge holding unit 631 (step S906). Then, it is judged whether or not the number of times of exposure reaches a predetermined number of times of exposure (step S907). In the case where the number of times of exposure does not reach the predetermined number of times of exposure (step S907: No), processing from step S901 is executed again.

On the other hand, in the case where the number of times of exposure reaches the predetermined number of times of exposure (step S907: Yes), an infrared light signal based on the electric charges held in the infrared light electric charge holding units 621 and 631 is generated (step S908). Finally, the distance measurement unit 50 calculates a distance on the basis of the generated infrared light signal (step S909).

In the first embodiment of the present technology, as described with reference to FIG. 7, exposure is performed while the first exposure period and the second exposure period are respectively set at the Za and the Zc, and the Zb and the Zd of the pixel group 660. By this means, infrared light signals based on the first exposure period and the second exposure period can be acquired at the same time, so that it is possible to shorten the distance measurement period. Further, by performing photoelectric conversion using two infrared light converting units which have light receiving faces having the same size as that of the light receiving face of the visible light converting unit in the visible light pixel, and which are apparently connected in parallel, it is possible to improve sensitivity of the infrared light converting unit, because the sensitivity of the photoelectric converting unit, that is, an electric charge generation amount per unit time is proportional to the light receiving area of the photoelectric converting unit.

It is also possible to improve the sensitivity by constituting the infrared light converting unit having double the area of that of the visible light converting unit. However, there is a problem that it takes more time to transfer an electric charge by the electric charge transferring unit in the photoelectric converting unit having a large area. In the n-type semiconductor region 512 of the photoelectric converting unit 141 described with reference to FIG. 5, accumulated electric charges are transferred mainly through diffusion of the electric charges. On the other hand, in the first embodiment of the present technology, as described above, two infrared light converting units each of which has a light receiving face having the same size as that of the light receiving face of the visible light converting unit in the visible light pixel are used, so that it is possible to make the length of time required for transferring the electric charge the same as that in the visible light converting unit.

Further, the infrared light converting blocks 620 and 630 in FIG. 7 are disposed adjacent to each other. Therefore, infrared light signals generated by these infrared light converting blocks can be regarded as infrared light signals based on the same subject. It is possible to improve accuracy of distance measurement compared to a case where the infrared light converting blocks 620 and 630 are disposed away from each other.

Further, the visible light converting block is configured with four visible light pixels and is configured in a Bayer array. Meanwhile, the pixel group 660 in the first embodiment of the present technology is also configured with four Z pixels. By this means, it is possible to simplify arrangement of Z pixels in the pixel array unit 100. The solid-state imaging apparatus 20 is configured by replacing the visible light pixels of the pixel array unit 100 with infrared light pixels. In this event, because the number of the visible light converting blocks is the same as the number of pixel groups 660 formed with Z pixels, it is possible to replace the visible light pixels with the infrared light pixels without changing a ratio of R pixels, G pixels and B pixels with respect to the whole of the pixel array unit 100.

Still further, in the first embodiment of the present technology, the size of the Z pixel is made substantially the same as that of the visible light pixel. By this means, because it is possible to share a configuration of the diffusion layer, a wiring pattern, or the like, in the semiconductor substrate between the Z pixel and the visible light pixel except a configuration of a color filter, it is possible to manufacture the Z pixel and the visible light pixel on the basis of the same design rule.

In this manner, according to the first embodiment of the present technology, by using two Z pixels having substantially the same size as that of the visible light pixel in parallel, it is possible to improve sensitivity of the Z pixel. By this means, it is possible to improve accuracy of distance measurement.

Modified Example

While, in the above-described embodiment, the visible light converting block is configured with three pixels of an R pixel, a G pixel and a B pixel as the visible light pixels, the visible light converting block may be configured with four pixels further including a W pixel for white light. For example, it is possible to employ a configuration in which one pixel among two G pixels in a Bayer array is replaced with a W pixel.

Figure 12:
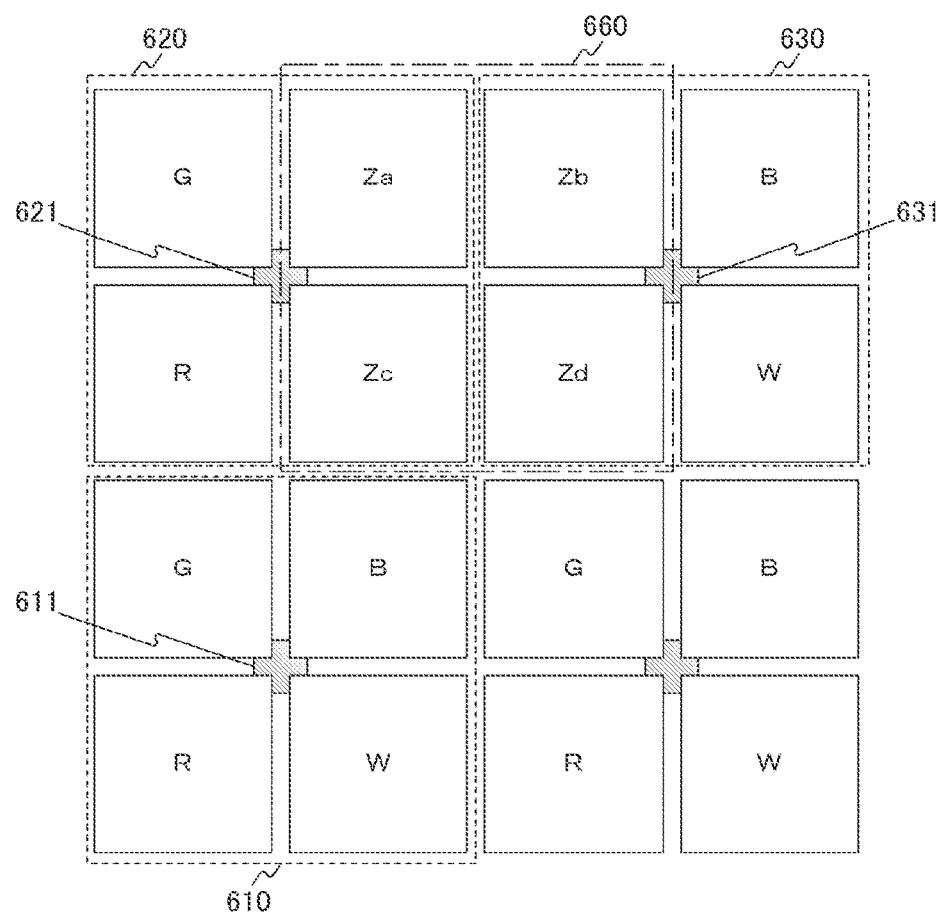
FIG. 12 is a diagram illustrating a visible light converting block in a modified example of the first embodiment of the present technology.

FIG. 12 is a diagram illustrating a visible light converting block in a modified example of the first embodiment of the present technology. In FIG. 12, a pixel where a character of W is described corresponds to a W pixel, and a color filter which transmits white light is disposed at the pixel. Also in FIG. 12, because the number of the visible light converting blocks 611 is the same as the number of pixel groups 660 formed with Z pixels, it is possible to replace the visible light pixels with the infrared light pixels without changing a ratio of the R pixel, the G pixel, the B pixel and the W pixel with respect to the whole pixel array unit 100.

Second Embodiment

In the above-described embodiment, a distance is measured using the infrared light converting block configured with two Z pixels and two visible light pixels. Meanwhile, in the second embodiment of the present technology, a distance is measured using an infrared light converting block configured with four Z pixels. By this means, it is possible to reduce the number of signal lines connected to the Z pixels.

[Operation of Solid-State Imaging Apparatus]

Figure 13:
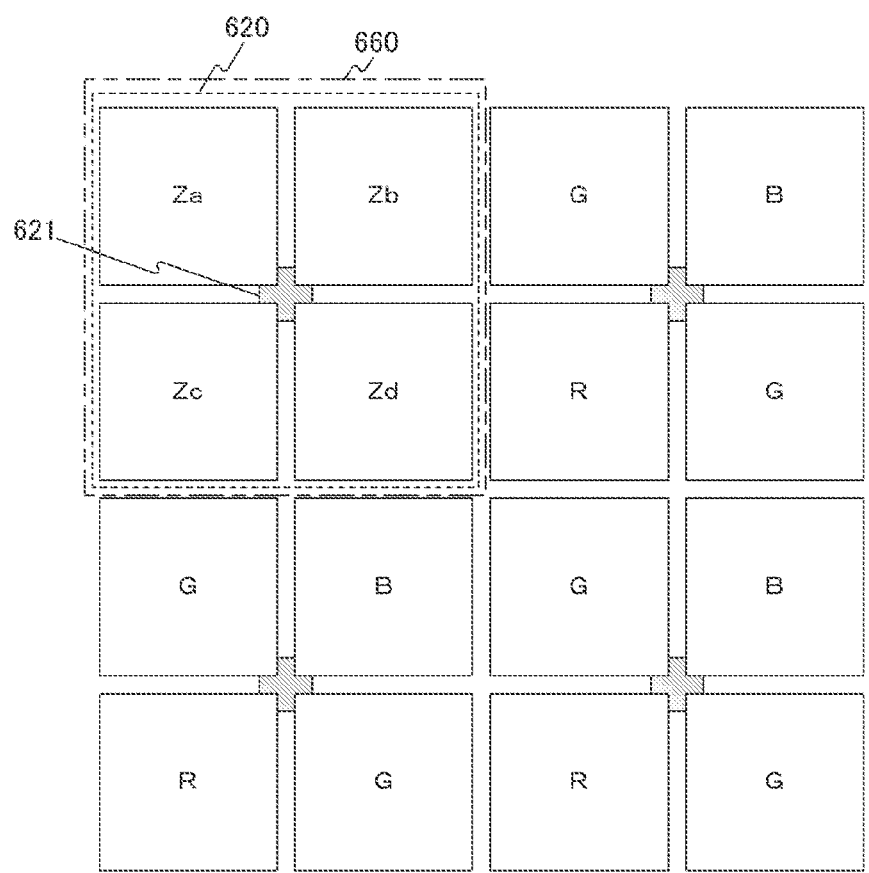
FIG. 13 is a diagram illustrating an infrared light converting block in a second embodiment of the present technology.

FIG. 13 is a diagram illustrating an infrared light converting block in the second embodiment of the present technology. The infrared light converting block 620 in FIG. 13 is different from the infrared light converting block 620 described with reference to FIG. 7 in that all the pixels are configured with Z pixels. That is, the infrared light converting block 620 in FIG. 13 employs a configuration where the pixels groups 660 formed with Z pixels in FIG. 7 match pixels of the infrared light converting block 620. Therefore, at Z pixels in the infrared light converting block 620 in FIG. 13, the electric charge transferring units and the over flow drains can be made to operate at the same time at the four pixels. Because an infrared light signal is generated using four Z pixels, it is possible to improve sensitivity of the Z pixel, so that it is possible to improve accuracy of distance measurement. Because other configuration of the solid-state imaging apparatus 20 and the imaging system 1 except this is similar to that of the solid-state imaging apparatus 20 and the imaging system 1 in the first embodiment of the present technology, description will be omitted.

Figure 14:
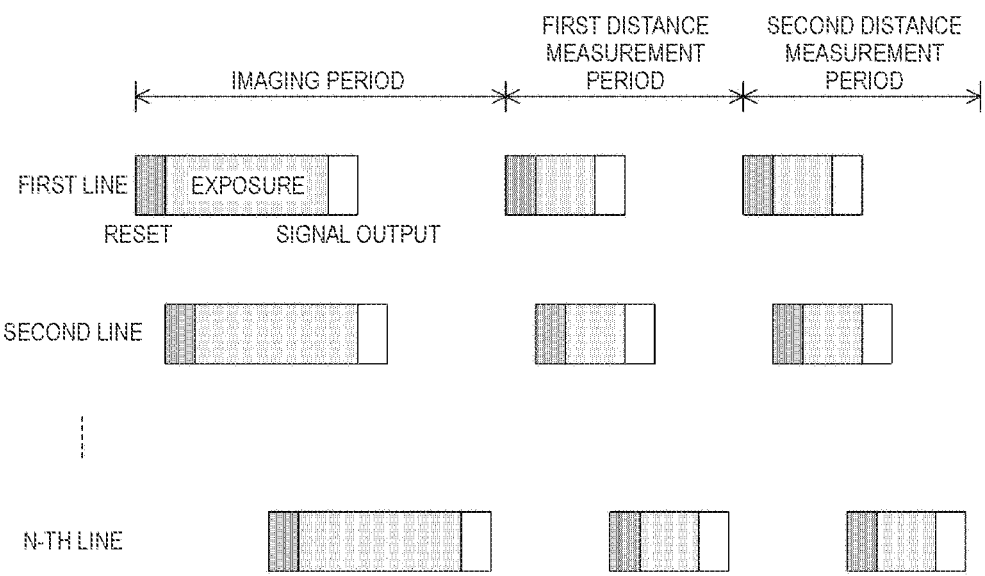
FIG. 14 is a diagram illustrating relationship between an imaging period and a distance measurement period in the second embodiment of the present technology.

FIG. 14 is a diagram illustrating relationship between an imaging period and a distance measurement period in the second embodiment of the present technology. The distance measurement period of the second embodiment of the present technology is different from the distance measurement period described with reference to FIG. 8 in that a first distance measurement period and a second distance measurement period which are two distance measurement periods are executed after the imaging period.

[Imaging Method]

Figure 15:
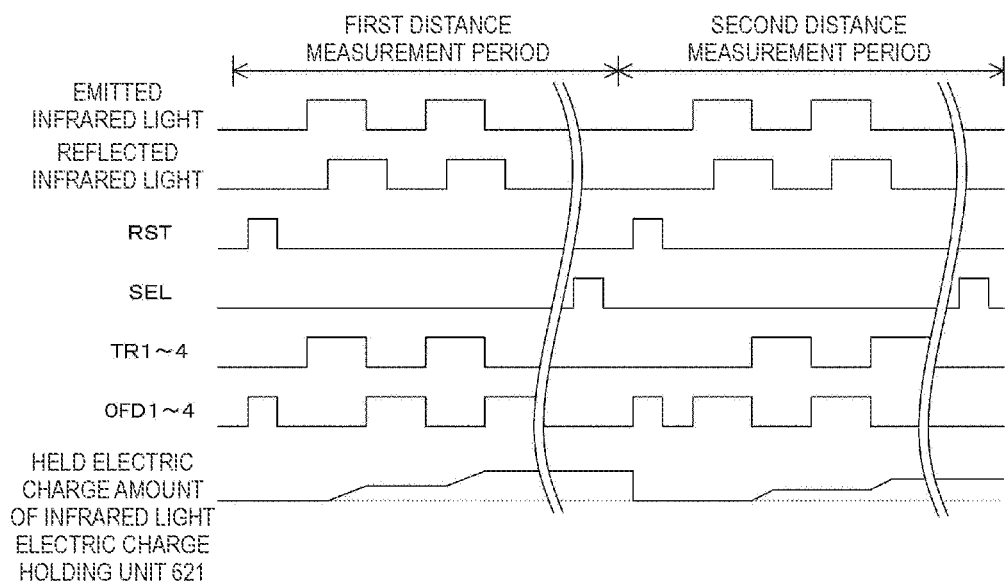
FIG. 15 is a diagram illustrating an imaging method in the second embodiment of the present technology.

FIG. 15 is a diagram illustrating an imaging method in the second embodiment of the present technology. The same signal is input to the electric charge transferring units and the over flow drains of all the Z pixels of the infrared light converting block 620 as mentioned above. Because operation in the first distance measurement period and the second distance measurement period in FIG. 15 is similar to operation in the infrared light converting blocks 620 and 630 described with reference to FIG. 10, description will be omitted.

In this manner, according to the second embodiment of the present technology, by measuring a distance using an infrared light converting block configured with four Z pixels, it is possible to use a common signal as signals to be supplied to the Z pixels. By this means, it is possible to reduce the number of signal lines.

Third Embodiment

In the above-described first embodiment, a distance is measured using the infrared light converting block configured with two Z pixels and two visible light converting pixels. Meanwhile, in the third embodiment of the present technology, a distance is measured using an infrared light converting block configured with one Z pixel and three visible light converting pixels. By this means, it is possible to use a distance measurement method of a scheme in which exposure of reflected infrared light is performed in four phases.

[Operation of Solid-State Imaging Apparatus]

Figure 16:
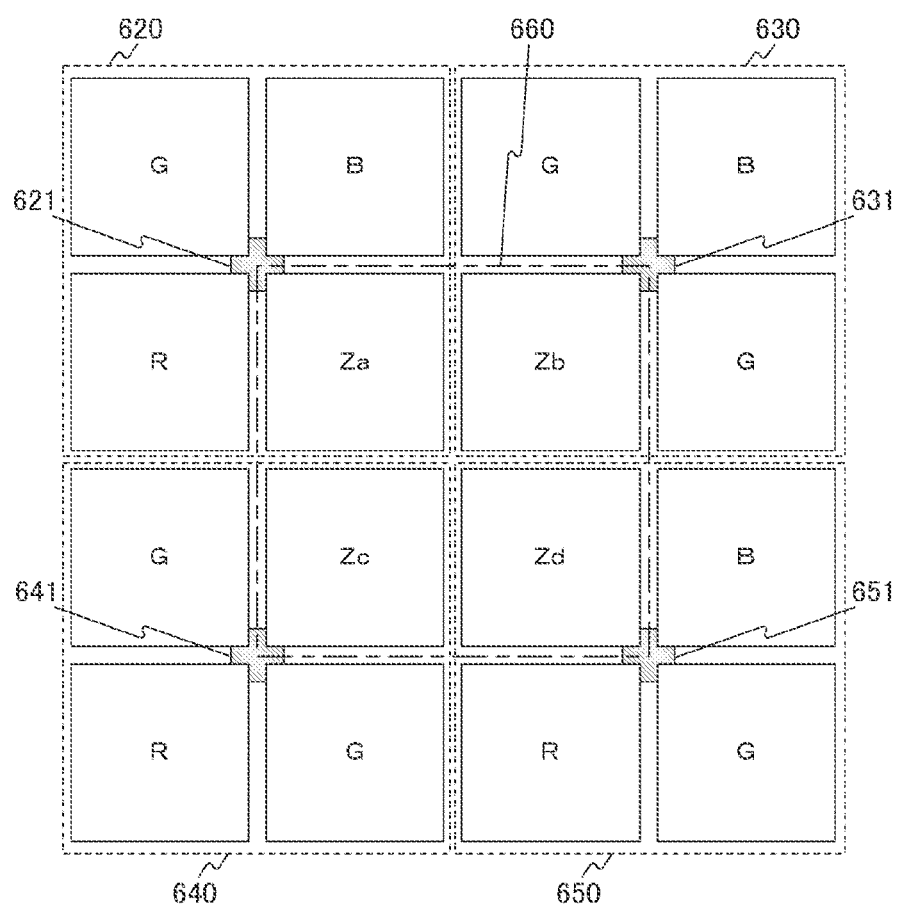
FIG. 16 is a diagram illustrating an infrared light converting block in a third embodiment of the present technology.

FIG. 16 is a diagram illustrating the infrared light converting block in the third embodiment of the present technology. The infrared light converting blocks 620, 630, 640 and 650 in FIG. 16 are different from the infrared light converting blocks 620 and 630 described with reference to FIG. 7 in that each of the infrared converting blocks 620, 630, 640 and 650 are configured with one Z pixel and three visible light converting pixels. Further, the pixel group 660 formed with Z pixels in FIG. 16 is disposed across these four infrared light converting blocks, and disposed across two lines. Because configurations of the solid-state imaging apparatus 20 and the imaging system 1 other than this are similar to those of the solid-state imaging apparatus 20 and the imaging system 1 in the first embodiment of the present technology, description will be omitted.

[Principle of Distance Measurement]

Figure 17:
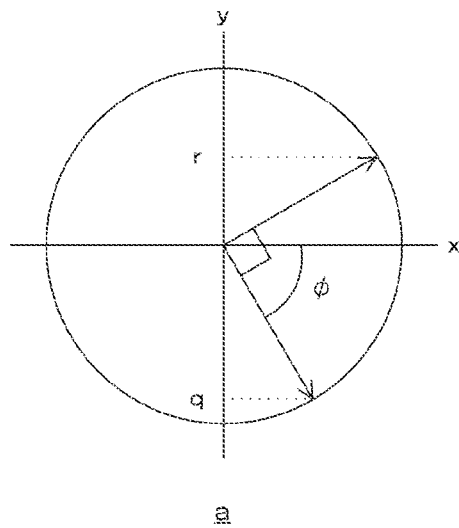
FIG. 17 is a diagram illustrating a distance measurement method in the third embodiment of the present technology.
Figure 17:
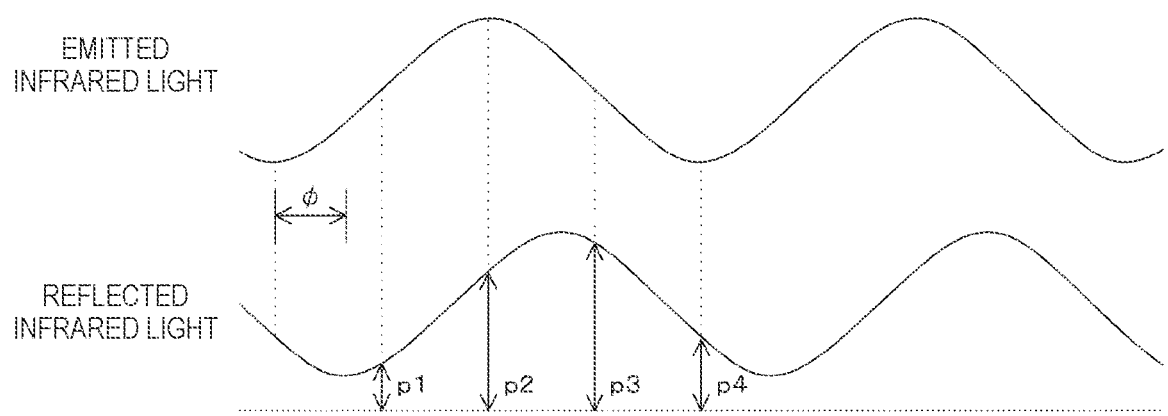
Figure 17:
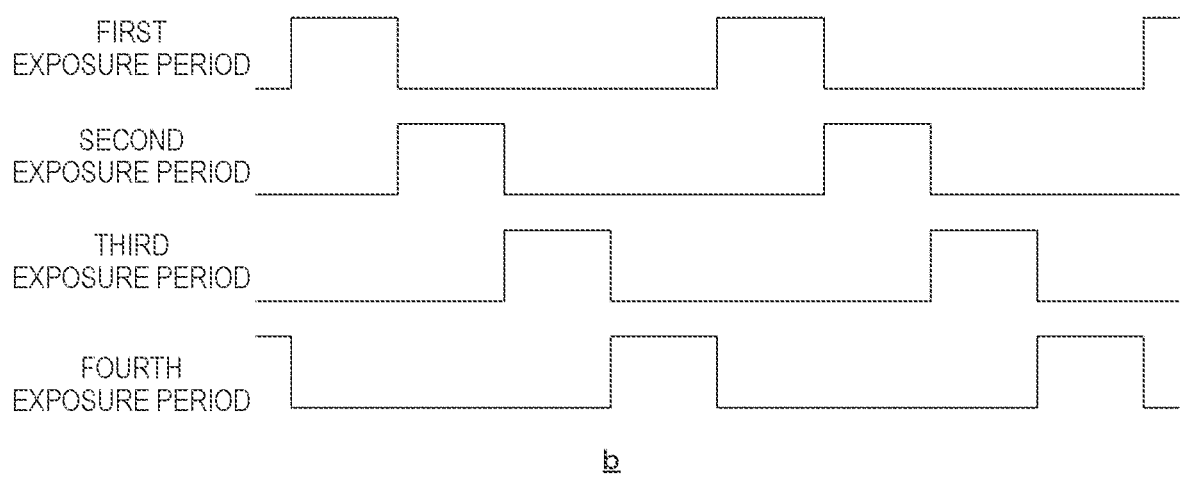

FIG. 17 is a diagram illustrating a distance measurement method in the third embodiment of the present technology. In the distance measurement method illustrated in FIG. 17, a distance is measured by emitting infrared light whose amplitude is modulated with a sine wave and measuring a phase delay of reflected infrared light. FIG. 17a illustrates relationship between the emitted infrared light and the reflected infrared light. If the emitted infrared light is indicated in a positive x axis direction in FIG. 17a, the reflected infrared light has a waveform of a phase which delays in accordance with the distance to the subject. If this delay is indicated with $\varphi$, $\varphi$ can be expressed with the following equation.

$$\varphi = \tan^{-1}(q/r)$$

where q is a crest value of a reflective wave, and r indicates a crest value of a reflective wave whose phase advances by 90°.

FIG. 17b illustrates a method for acquiring q and r. A crest value of the reflected infrared light is measured for each phase of 90° in one cycle of the emitted infrared light. When these are indicated with p1 to p4, q and r can be expressed with the following equations.

$$q = |(p1-p3)/2|$$

$$r = |(p2-p4)/2|$$

In this manner, by calculating respective differences between p1 and p3, and p2 and p4, it is possible to remove influence of infrared light other than reflected infrared light. $\varphi$ can be calculated using the following equation.

$$\varphi = \tan^{-1}|(p1-p3)/(p2-p4)|$$

D described with reference to FIG. 6 can be calculated as follows.

$$D = T \times \varphi/2\pi$$

A distance L to the subject will be calculated next using equation 1. Here, p1 to p4 can be acquired by performing exposure while a phase is separated by 90° for one cycle of the emitted infrared light, accumulating generated electric charges and converting the electric charges into an infrared light signal. In FIG. 17b, these are indicated as first to fourth exposure periods.

As described above, in the distance measurement method illustrated in FIG. 17, because a distance is measured by using four Z pixels and calculating differences, it is possible to remove influence of infrared light other than reflected infrared light. Therefore, compared to the distance measurement method described with reference to FIG. 6, it is possible to perform measurement with high accuracy.

[Imaging Method]

Figure 18:
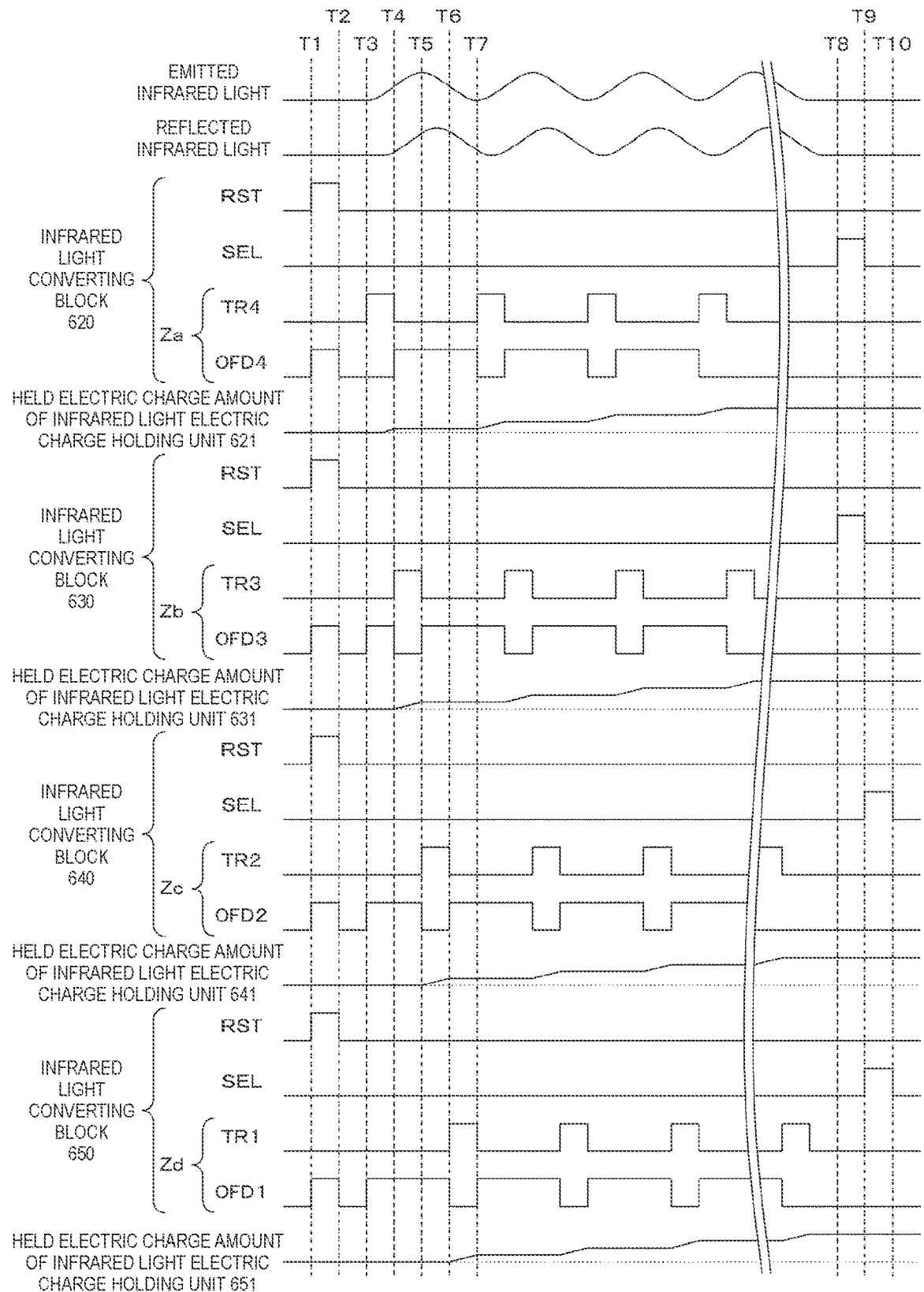
FIG. 18 is a diagram illustrating an imaging method in the third embodiment of the present technology.

FIG. 18 is a diagram illustrating an imaging method in a third embodiment of the present technology. A case will be assumed where the first to the fourth exposure periods described with reference to FIG. 17 are respectively set for Za, Zb, Zc and Zd in FIG. 18. First, ON signals are input to RSTs of the infrared light converting blocks 620, 630, 640 and 650 to discharge the electric charges held in the infrared light electric charge holding units 621, 631, 641 and 651 (T1). Note that name of the infrared light converting blocks will be omitted in the following description.

At the same time as input of signals to the RSTs, ON signals are input to the OFD4, the OFD3, the OFD2 and the OFD1, and the photoelectric converting units 111, 121, 131 and 141 are reset. After reset is finished, input of the ON signals to the RSTs and the OFD1 to the OFD4 is stopped (T2).

Then, emission of infrared light is started, and ON signals are input to the TR4, the OFD3, the OFD2 and the OFD1 (T3). By this means, exposure based on the reflected infrared light is performed at the pixel 140, and electric charges are accumulated in the infrared light electric charge holding unit 621.

Then, input of the ON signals to the TR4 and the OFD3 is stopped, and ON signals are input to the TR3, the OFD4, the OFD2 and the OFD1 (T4). By this means, exposure based on the reflected infrared light is performed at the pixel 130, and electric charges are accumulated in the infrared light electric charge holding unit 631.

Then, input of the ON signals to the TR3 and the OFD2 is stopped, and ON signals are input to the TR2, the OFD4, the OFD3 and the OFD1 (T5). By this means, exposure based on the reflected infrared light is performed at the pixel 120, and electric charges are accumulated in the infrared light electric charge holding unit 641.

Then, input of the ON signals to the TR2 and the OFD1 is stopped, and ON signals are input to the TR1, the OFD4, the OFD3 and the OFD2 (T6). By this means, exposure based on the reflected infrared light is performed at the pixel 110, and electric charges are accumulated in the infrared light electric charge holding unit 651.

Then, input of the ON signals to the TR1 and the OFD4 is stopped (T7). Thereafter, operation from T3 to T6 is repeated the predetermined number of times. By this means, electric charges based on the reflected infrared light are accumulated in the infrared light electric charge holding units 621, 631, 641 and 651.

Then, ON signals are input to the SELs of the infrared light converting blocks 620 and 630 (T8). By this means, an infrared light signal based on the electric charges held in the infrared light electric charge holding units 621 and 631 is generated. Then, input of the ON signals to the SELs of the infrared light converting blocks 620 and 630 is stopped, and ON signals are input to the SELs of the infrared light converting blocks 640 and 650 (T9). By this means, an infrared light signal based on the electric charges held in the infrared light electric charge holding units 641 and 651 is generated. As described with reference to FIG. 16, because the pixel group 660 of Z pixels are disposed across two lines, it is necessary to input a signal of the SEL for each one line to acquire an infrared light signal. Then, input of the ON signals to the SELs of the infrared light converting blocks 640 and 650 is stopped, and a distance measurement period is finished (T10).

By acquiring the above-described infrared light signal based on the electric charges held in the infrared light electric charge holding units 621, 631, 641 and 651, it is possible to obtain an infrared light signal whose phase is shifted by 90°. The distance measurement unit 50 measures a distance to the subject on the basis of these infrared light signals.

In this manner, according to the third embodiment of the present technology, it is possible to use a distance measurement method of a scheme in which exposure of the reflected infrared light is performed in separated four phases. By this means, it is possible to remove influence of infrared light other than reflected infrared light, so that it is possible to improve accuracy of distance measurement.

Fourth Embodiment

In the above-described third embodiment, Z pixels of the pixel group 660 are disposed adjacent to each other. Meanwhile, in a fourth embodiment of the present technology, Z pixels are disposed at positions of G pixels in the Bayer array in the infrared light converting block. By this means, it is possible to facilitate de-mosaic processing.

[Operation of Solid-State Imaging Apparatus]

Figure 19:
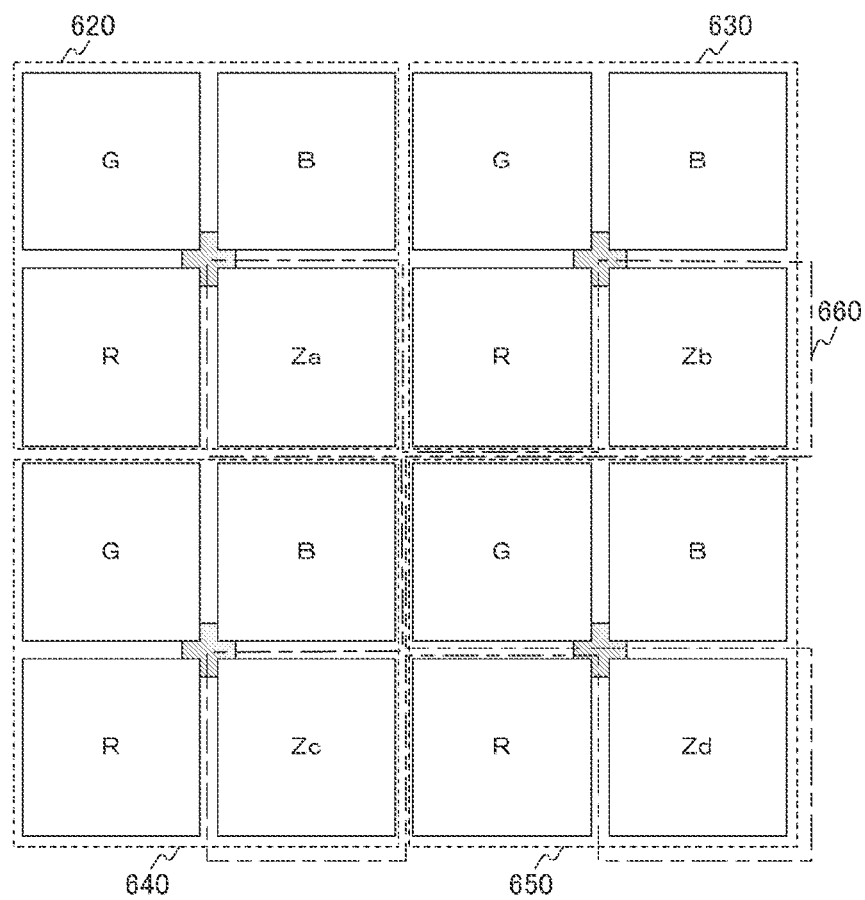
FIG. 19 is a diagram illustrating an infrared light converting block in a fourth embodiment of the present technology.

FIG. 19 is a diagram illustrating an infrared light converting block in the fourth embodiment of the present technology. The infrared light converting blocks 620, 630, 640 and 650 in FIG. 19 are configured with one Z pixel and three visible light converting pixels. However, the infrared light converting blocks 620, 630, 640 and 650 in FIG. 19 are different from the infrared light converting blocks 620, 630, 640 and 650 described with reference to FIG. 16 in that Z pixels are disposed at positions of G pixels in the Bayer array of the respective photoelectric converting blocks. Because configurations of the solid-state imaging apparatus 20 and the imaging system 1 other than this are similar to those of the solid-state imaging apparatus 20 and the imaging system 1 in the third embodiment of the present technology, description will be omitted. Further, as the distance measurement method, it is possible to employ a distance measurement method of a scheme in which exposure of the reflected infrared light is performed in separated four phases in a similar manner to the third embodiment of the present technology.

As described above, the image processing unit 40 can perform de-mosaic processing on the visible light signal output from the solid-state imaging apparatus 20. This de-mosaic processing is processing for interpolating a signal of color insufficient in each pixel, and, in the case where the processing is applied to the Z pixel, it is necessary to interpolate signals corresponding to three of red light, green light and blue light. This interpolation can be performed by calculating an average value of the visible light signals output by the visible light pixels disposed around the Z pixel among the visible light pixels corresponding to the corresponding color. However, for the visible light signal corresponding to green light in the Z pixel, interpolation can be performed using a signal of a G pixel included in the same infrared light converting block. By this means, it is possible to simplify de-mosaic processing of the visible light signal corresponding to green light.

In this manner, according to the fourth embodiment of the present technology, by disposing Z pixels at positions of the G pixels in the Bayer array, it is possible to perform interpolation using the visible light signals of G pixels included in the same infrared light converting block upon de-mosaicing. By this means, it is possible to simplify de-mosaic processing of the visible light signals.

5. Fifth Embodiment

In the above-described fourth embodiment of the present technology, electric charges generated at the Z pixels are transferred and held by a pair of the electric charge transferring unit and the electric charge holding unit. Meanwhile, in the fifth embodiment of the present technology, two pairs of the electric charge transferring units and the electric charge holding units are used. By this means, it is possible to improve accuracy of distance measurement.

[Arrangement of Pixels]

Figure 20:
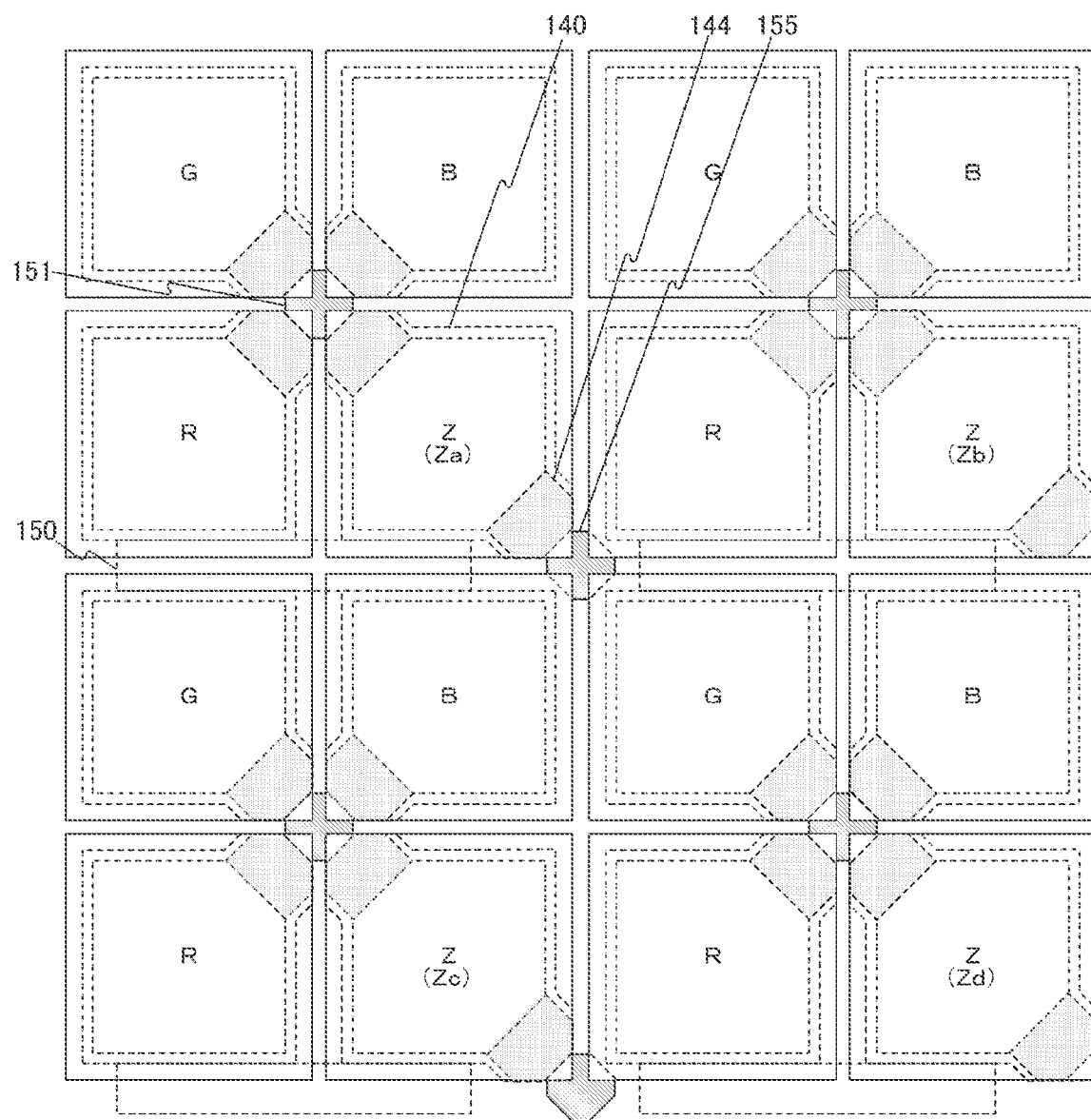
FIG. 20 is a diagram illustrating an arrangement example of pixels in a fifth embodiment of the present technology.

FIG. 20 is a diagram illustrating an arrangement example of pixels in the fifth embodiment of the present technology. A pixel 140 which is a Z pixel (Za) in FIG. 20 is different from the Z pixel 140 described with reference to FIG. 4 in that an electric charge transferring unit 144 and an electric charge holding unit 155 are further provided. Note that other Z pixels (Zb, Zc and Zd) in FIG. 20 are different from the Z pixels described with reference to FIG. 4 in a similar manner.

[Circuit Configuration of Pixel]

Figure 21:
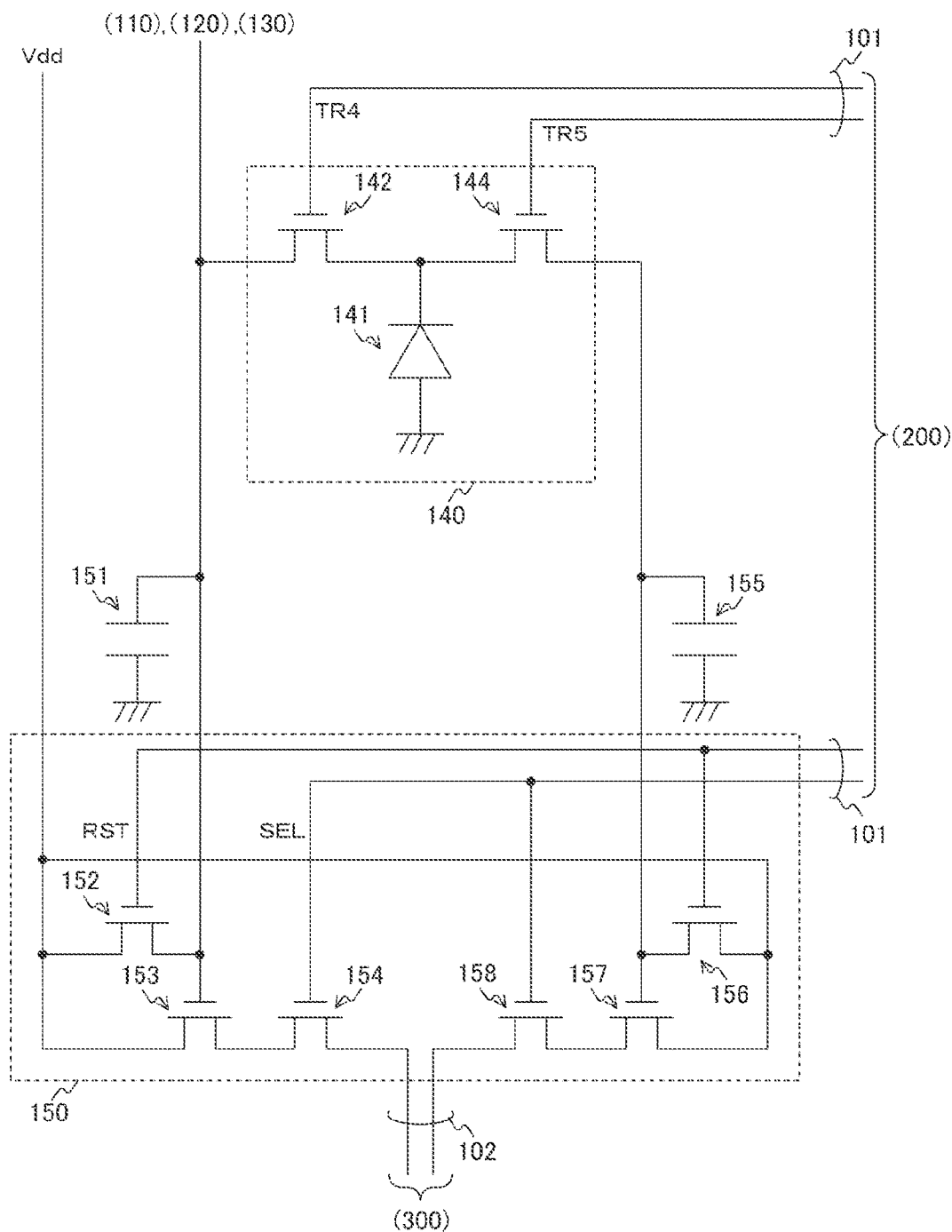
FIG. 21 is a diagram illustrating a configuration example of a pixel in the fifth embodiment of the present technology.

FIG. 21 is a diagram illustrating a configuration diagram of a pixel in the fifth embodiment of the present technology. FIG. 21 illustrates circuit configurations of the Z pixel 140, the signal generating unit 150 and the electric charge holding units 151 and 155 in the infrared light converting block.

The pixel 140 in FIG. 21 does not have to include the over flow drain 143. Instead, an electric charge transferring unit 144 is further provided. Further, the signal line 101 includes a TR5 instead of the OFD4. The transfer 5 (TR5) is a signal line for transmitting a control signal to the electric charge transferring unit 144. As illustrated in FIG. 21, an anode of the photoelectric converting unit 141 is grounded, and a cathode is connected to sources of the electric charge transferring units 142 and 144. Gates of the electric charge transferring units 142 and 144 are respectively connected to the TR4 and the TR5. A drain of the electric charge transferring unit 142 is connected to one end of the electric charge holding unit 151 in a similar manner to the pixel 140 described with reference to FIG. 3. Meanwhile, a drain of the electric charge transferring unit 144 is connected to one end of the electric charge holding unit 155.

The signal generating unit 150 is different from the signal generating unit 150 described with reference to FIG. 3 in that MOS transistors 156 to 158 are further provided. As illustrated in FIG. 21, drains of the MOS transistors 156 and 157 are connected to a Vdd. A source of the MOS transistor 156 and a gate of the MOS transistor 157 are connected to one end of the electric charge holding unit 155 to which the drain of the electric charge transferring unit 144 described above is connected. The other end of the electric charge holding unit 155 is grounded. A source of the MOS transistor 157 is connected to a drain of the MOS transistor 158, and a source of the MOS transistor 158 is connected to the signal line 102. As illustrated in FIG. 21, the signal line 102 is configured with two signal lines, and transmits signals respectively output from the MOS transistors 154 and 158. Gates of the MOS transistor 156 and the MOS transistor 158 are respectively connected to the signal lines RST and SEL.

The MOS transistor 157 is a MOS transistor which generates a signal in accordance with the electric charge held in the electric charge holding unit 155. The MOS transistor 158 is a MOS transistor which outputs a signal generated by the MOS transistor 157 to the signal line 102 as an image signal. The MOS transistor 156 is a MOS transistor which discharges the electric charge held in the electric charge holding unit 155.

In this manner, at the pixel 140 in FIG. 21, the electric charge generated by the photoelectric converting unit 141 can be separated and transferred to the electric charge holding units 151 and 155. Because the configuration of the pixel other than this is similar to the configuration of the pixel, or the like, described with reference to FIG. 3, description will be omitted. Further, as a distance measurement method in the fifth embodiment of the present technology, it is possible to use the distance measurement method described with reference to FIG. 6. The configurations of the solid-state imaging apparatus 20 and the imaging system 1 other than this is similar to those of the solid-state imaging apparatus 20 and the imaging system 1 in the first embodiment of the present technology, description will be omitted.

[Imaging Method]

Figure 22:
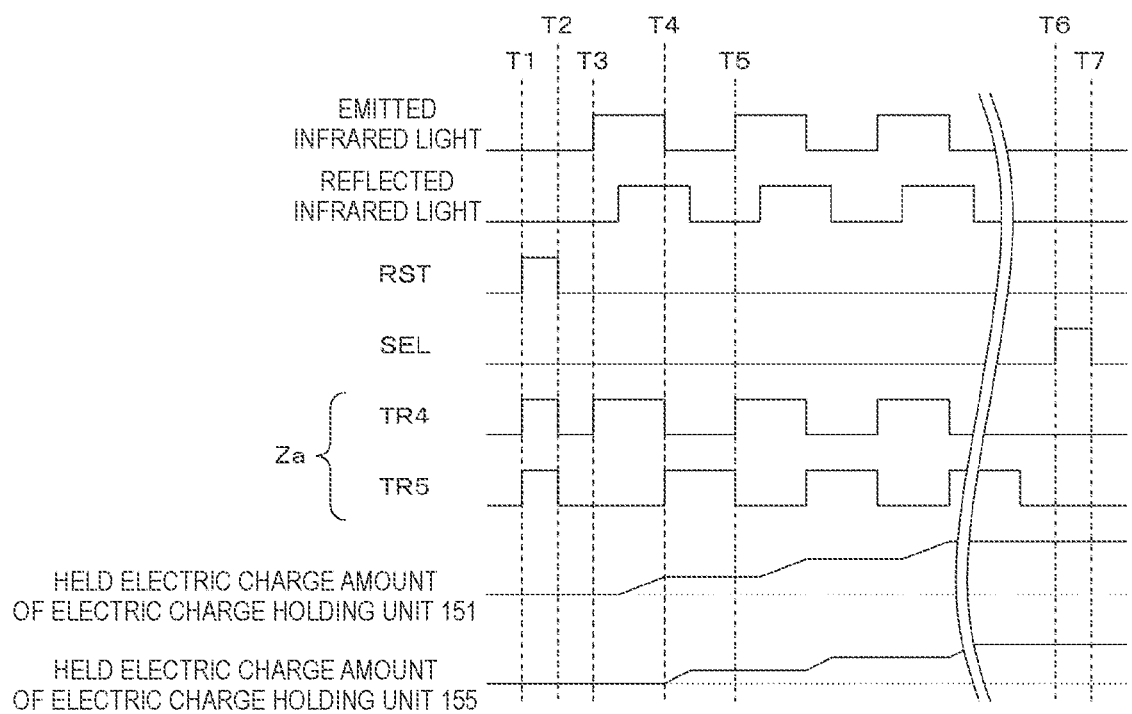
FIG. 22 is a diagram illustrating an imaging method in the fifth embodiment of the present technology.

FIG. 22 is a diagram illustrating an imaging method in the fifth embodiment of the present technology. FIG. 22 illustrates relationship, or the like, between an input signal and an output signal at the pixel 140 described with reference to FIG. 20.

First, ON signals are input to the RST, the TR4 and the TR5 (T1). By this means, the photoelectric converting unit 141 is reset, and the electric charges held in the electric charge holding units 151 and 155 are discharged. After reset is finished, the above-described input of the ON signals to the RST, the TR4 and the TR5 is stopped (T2).

Then, infrared light is emitted from the infrared light emitting unit 60, and an ON signal is input to the TR4 (T3). By this means, an electric charge based on the reflected infrared light generated by the photoelectric converting unit 141 is held in the electric charge holding unit 151.

Then, emission of the infrared light by the infrared light emitting unit 60 is stopped, and input of the ON signal to the TR4 is stopped. At the same time, an ON signal is input to the TR5 (T4). By this means, an electric charge based on the reflected infrared light generated by the photoelectric converting unit 141 is held in the electric charge holding unit 155.

Thereafter, operation of T3 and T4 is repeated the predetermined number of times. By this means, electric charges based on the reflected infrared light are accumulated in the electric charge holding units 151 and 155.

Then, an ON signal is input to the SEL (T6). By this means, infrared light signals based on the electric charges held in the electric charge holding units 151 and 155 are respectively output. Then, input of the ON signal to the SEL is stopped, and the distance measurement period is finished (T7). A distance is calculated by the distance measurement unit 50 on the basis of the output infrared light signals.

Note that, in the case where light receiving sensitivity of infrared light is insufficient, it is also possible to generate infrared light signals at the Zb, the Zc and the Zd in a similar manner, and add these to be used for calculation of the distance.

In this manner, electric charges based on photoelectric conversion in synchronization with emitted infrared light are accumulated in the electric charge holding unit 151. Meanwhile, in the electric charge holding unit 155, electric charges obtained as a result of photoelectric conversion being performed at a timing where a phase is shifted by 180° with respect to the emitted infrared light, are accumulated. That is, it is possible to execute the first and the second exposure periods described with reference to FIG. 6 with one pixel. Therefore, compared to a case where the first and the second exposure periods are executed with different pixels, it is possible to reduce influence of variation, or the like, of sensitivity in photoelectric conversion, so that it is possible to improve accuracy of distance measurement. Further, because all the electric charges generated by the photoelectric converting unit 141 are transferred to the electric charge holding units 151 and 155, an over flow drain does not have to be provided at the pixel 140.

In this manner, according to the fifth embodiment of the present technology, it is possible to generate two infrared light signals required for measuring a distance, with one pixel. By this means, it is possible to reduce influence of variation, or the like, of sensitivity in photoelectric conversion, so that it is possible to improve accuracy of distance measurement.

Modified Example

In the above-described fifth embodiment of the present technology, a distance is measured in a configuration where an electric charge transferring unit and an electric charge holding unit of the Z pixels are added to the infrared light converting block where Z pixels are disposed at positions of G pixels in the Bayer array. Meanwhile, it is also possible to measure a distance in a configuration where an electric charge transferring unit and an electric charge holding unit are added to the Z pixels in the first embodiment of the present technology. Specifically, electric charge transferring units are added to the photoelectric converting unit 121 of the pixel 120 and the photoelectric converting unit 141 of the pixel 140 described with reference to FIG. 4. An electric charge holding unit to which the added electric charge holding units are commonly connected is further provided. By this means, it is possible to reduce influence of variation, or the like, of sensitivity in photoelectric conversion, so that, in the case where the infrared light converting block is configured with two infrared light converting units and two visible light converting units, it is possible to improve accuracy of distance measurement.

In addition, the above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

Also, the processing sequences that are described in the embodiments described above may be handled as a method having a series of sequences or may be handled as a program for causing a computer to execute the series of sequences and recording medium storing the program. As the recording medium, a hard disk, a CD (Compact Disc), an MD (Mini-Disc), and a DVD (Digital Versatile Disc), a memory card, and a Blu-ray disc (registered trademark) can be used.

Effects described in the present description are just examples, the effects are not limited, and there may be other effects.

Additionally, the present technology may also be configured as below.

(1)
A solid-state imaging apparatus including:
a visible light converting block that includes a plurality of visible light converting units in which light receiving faces for receiving visible light are disposed and configured to generate electric charges in accordance with a light receiving amount of the received visible light, and a visible light electric charge holding unit configured to exclusively hold the electric charges respectively generated by the plurality of visible light converting units in periods different from each other; and
an infrared light converting block that includes a plurality of infrared light converting units in which light receiving faces which have substantially the same size as size of the light receiving faces of the visible light converting units and which receive infrared light are disposed and configured to generate electric charges in accordance with a light receiving amount of the received infrared light, and an infrared light electric charge holding unit configured to collectively and simultaneously hold the electric charges respectively generated by the plurality of infrared light converting units.

(2)
The solid-state imaging apparatus according to (1),
in which the visible light converting block includes the four visible light converting units and the visible light electric charge holding unit.

(3)
The solid-state imaging apparatus according to (2),
in which the infrared light converting block includes the four infrared light converting units and the infrared light electric charge holding unit.

(4)
The solid-state imaging apparatus according to (2),
in which the infrared light converting block includes:
the two infrared light converting units;
the two visible light converting units; and
the infrared light electric charge holding unit configured to collectively and simultaneously hold the electric charges respectively generated by the two infrared light converting units in the case of holding the electric charges generated by the two infrared light converting units, and exclusively hold the electric charges respectively generated by the two visible light converting units in periods different from each other in the case of holding the electric charges generated by the two visible light converting units.

(5)
The solid-state imaging apparatus according to any of (2) to (4),
in which the visible light converting block includes the visible light electric charge holding unit and the four visible light converting units in which a red light converting unit which is the visible light converting unit configured to generate the electric charge in accordance with red light, a green light converting unit which is the visible light converting unit configured to generate the electric charge in accordance with green light, and a blue light converting unit which is the visible light converting unit configured to generate the electric charge in accordance with blue light are arranged in a Bayer array.

(6)
The solid-state imaging apparatus according to any of (2) to (4),
in which the visible light converting block includes a red light converting unit which is the visible light converting unit configured to generate the electric charge in accordance with red light, a green light converting unit which is the visible light converting unit configured to generate the electric charge in accordance with green light, a blue light converting unit which is the visible light converting unit configured to generate the electric charge in accordance with blue light, a white light converting unit which is the visible light converting unit configured to generate the electric charge in accordance with white light, and the visible light electric charge holding unit.

(7)
The solid-state imaging apparatus according to any of (2) to (4),
in which the infrared light converting block further includes an infrared light electric charge transferring unit configured to transfer the electric charges respectively generated by the plurality of infrared light converting units to the infrared light electric charge holding unit by conducting electricity between the plurality of infrared light converting units and the infrared light electric charge holding unit at a same time.

(8)
The solid-state imaging apparatus according to any of (1) to (7), further including
an infrared light signal generating unit configured to generate a signal in accordance with the electric charge held in the infrared light electric charge holding unit.

(9)
An imaging system including:
an infrared light emitting unit configured to emit infrared light to a subject;
a visible light converting block that includes a plurality of visible light converting units in which light receiving faces for receiving visible light are disposed and configured to generate electric charges in accordance with a light receiving amount of the received visible light, and a visible light electric charge holding unit configured to exclusively hold the electric charges respectively generated by the plurality of visible light converting units in periods different from each other;
an infrared light converting block that includes a plurality of infrared light converting units in which light receiving faces which have substantially the same size as size of the light receiving faces of the visible light converting units and which receive infrared light emitted and reflected by the subject are disposed and configured to generate electric charges in accordance with a light receiving amount of the received infrared light, and an infrared light electric charge holding unit configured to collectively and simultaneously hold the electric charges respectively generated by the plurality of infrared light converting units;

an infrared light signal generating unit configured to generate a signal in accordance with the electric charge held in the infrared light electric charge holding unit; and a distance measurement unit configured to measure a distance to the subject by measuring a time period from the emission at the infrared light emitting unit to the light reception at the infrared light converting unit of the infrared light converting block on the basis of the generated signal.

(10)

A distance measurement method including:

an infrared light emitting step of emitting infrared light to a subject;

an infrared light signal generating step of generating a signal in accordance with electric charges held in an infrared light electric charge holding unit in an infrared light converting block including a plurality of infrared light converting units in which light receiving faces which have substantially the same size as size of light receiving faces of visible light converting units in a visible light converting block and which receive infrared light emitted and reflected by the subject are disposed and configured to generate electric charges in accordance with a light receiving amount of the received infrared light and the infrared light electric charge holding unit configured to collectively and simultaneously hold the electric charges respectively generated by the plurality of infrared light converting units, the visible light converting block including a plurality of visible light converting units in which the light receiving faces for receiving visible light are disposed and configured to generate electric charges in accordance with a light receiving amount of the received visible light and a visible light electric charge holding unit configured to exclusively hold the electric charges respectively generated by the plurality of visible light converting units in periods different from each other; and a distance measurement step of measuring a distance to the subject by measuring a time period from emission of the infrared light to the light reception at the infrared light converting unit of the infrared light block on the basis of the generated signal.

REFERENCE SIGNS LIST 1 imaging system
10 lens
20 solid-state imaging apparatus
30 signal processing unit
40 image processing unit
50 distance measurement unit
60 infrared light emitting unit
100 pixel array unit
110, 120, 130, 140, 160, 170, 180, 190 pixel
111, 121, 131, 141, 161, 171, 181, 191 photoelectric converting unit
112, 123, 132, 143 over flow drain
113, 123, 133, 142, 144 electric charge transferring unit
119, 129, 139, 149 color filter
150 signal generating unit
151, 155, 159 electric charge holding unit
152 to 154, 156 to 158 MOS transistor
200 vertical driving unit
300 horizontal transferring unit
400 analog digital converter
610 visible light converting block
611 visible light electric charge holding unit
620, 620, 640, 650 infrared light converting block
621, 631, 641, 651 infrared light electric charge holding unit

The invention claimed is:

1. A light detecting device comprising:
a first pixel group including first to fourth light converting blocks configured to detect visible light;
a first floating diffusion region, wherein the first floating diffusion region is shared by the first to fourth light converting blocks;
a second pixel group including fifth to eighth light converting blocks configured to detect infrared light; and
a second floating diffusion region, wherein the second floating diffusion region is shared by the fifth to eighth light converting blocks, and wherein each of the first floating diffusion region and the second floating diffusion region is connected to a respective holder and a respective over flow drain.

2. The light detecting device according to claim 1, wherein the first pixel group is adjacent to the second pixel group in a plan view.

3. The light detecting device according to claim 1, wherein the first floating diffusion region is coupled to a first transistor, and wherein the second floating diffusion region is coupled to a second transistor.

4. The light detecting device according to claim 3, wherein the first transistor is different from the second transistor.

5. The light detecting device according to claim 1, further comprising:
a third pixel group including ninth to twelfth light converting blocks configured to detect the visible light; and
a third floating diffusion region, wherein the third floating diffusion region is shared by the ninth to twelfth light converting blocks.

6. The light detecting device according to claim 5, wherein the third pixel group is adjacent to the first pixel group and the second pixel group in a plan view.

7. A light detecting device comprising:
a first pixel group including first to fourth light converting blocks;
a first floating diffusion region, wherein the first light converting block and the second light converting block are configured to detect visible light, wherein the third light converting block and the fourth light converting block are configured to detect infrared light, and wherein the first floating diffusion region is shared by the first to fourth light converting blocks;
a second pixel group including fifth to eighth light converting blocks; and
a second floating diffusion region, wherein the fifth light converting block and the sixth light converting block are configured to detect the visible light, wherein the seventh light converting block and the eighth light converting block are configured to detect the infrared light, wherein the second floating diffusion region is shared by the fifth to eighth light converting blocks, and wherein each of the first floating diffusion region and the second floating diffusion region is connected to a respective holder and a respective over flow drain.

8. The light detecting device according to claim 7, wherein the first pixel group is adjacent to the second pixel group in a plan view.

9. The light detecting device according to claim 7, wherein the first floating diffusion region is coupled to a first transistor, and wherein the second floating diffusion region is coupled to a second transistor.

10. The light detecting device according to claim 9, wherein the first transistor is different from the second transistor.

11. The light detecting device according to claim 7, further comprising:
- a third pixel group including ninth to twelfth light converting blocks configured to detect the visible light; and
- a third floating diffusion region, wherein the third floating diffusion region is shared by the ninth to twelfth light converting blocks.

12. The light detecting device according to claim 11, wherein the third pixel group is adjacent to the first pixel group and the second pixel group in a plan view.

13. The light detecting device according to claim 7, wherein the third light converting block and the fourth light converting block are adjacent to the seventh light converting block and the eighth light converting block in a plan view.

* * * * *